US008859180B2

(12) United States Patent
Oikawa et al.

(10) Patent No.: US 8,859,180 B2
(45) Date of Patent: Oct. 14, 2014

(54) COPOLYMER AND COMPOSITION FOR SEMICONDUCTOR LITHOGRAPHY AND PROCESS FOR PRODUCING THE COPOLYMER

(75) Inventors: Tomo Oikawa, Chiba (JP); Takayoshi Okada, Chiba (JP); Masaaki Kudo, Chiba (JP); Takanori Yamagishi, Chiba (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 730 days.

(21) Appl. No.: 12/311,993

(22) PCT Filed: Oct. 19, 2007

(86) PCT No.: PCT/JP2007/001144
§ 371 (c)(1),
(2), (4) Date: Apr. 20, 2009

(87) PCT Pub. No.: WO2008/050477
PCT Pub. Date: May 2, 2008

(65) Prior Publication Data
US 2010/0062371 A1 Mar. 11, 2010

(30) Foreign Application Priority Data
Oct. 23, 2006 (JP) ................................. 2006-287353

(51) Int. Cl.
G03F 7/039 (2006.01)
C08F 2/06 (2006.01)
C08F 224/00 (2006.01)
C08F 220/18 (2006.01)
C08F 216/38 (2006.01)

(52) U.S. Cl.
USPC .......... 430/270.1; 430/910; 526/77; 526/266; 526/270; 526/282; 526/284; 526/328.5

(58) Field of Classification Search
None
See application file for complete search history.

(56) References Cited

U.S. PATENT DOCUMENTS

| 4,491,628 A | 1/1985 | Ito et al. ................... 430/176 |
| 4,603,101 A | 7/1986 | Crivello ................... 430/270 |
| 2004/0259028 A1 * | 12/2004 | Sato ...................... 430/270.1 |
| 2007/0065753 A1 * | 3/2007 | Mizutani et al. ......... 430/270.1 |
| 2008/0114139 A1 * | 5/2008 | Yamagishi et al. ........... 526/286 |

FOREIGN PATENT DOCUMENTS

| JP | 59-45439 | 3/1984 |
| JP | 62-115440 | 5/1987 |
| JP | 05-113667 | 5/1993 |
| JP | 09-073173 | 3/1997 |
| JP | 09-090637 | 4/1997 |
| JP | 10-026828 | 1/1998 |
| JP | 10-161313 | 6/1998 |
| JP | 10-207069 | 8/1998 |
| JP | 2000-26446 | 1/2000 |
| JP | 2001-166481 | 6/2001 |
| JP | 2001-242627 | 9/2001 |
| JP | 2002-97219 A | 4/2002 |
| JP | 2003-195506 A | 7/2003 |
| JP | 2005-227332 | 8/2005 |
| JP | 2005-234015 | 9/2005 |
| JP | 2005-309376 A | 11/2005 |
| JP | 2005-316259 | 11/2005 |
| JP | 2005-316259 A | 11/2005 |
| WO | WO2005/105869 A1 * | 11/2005 |

OTHER PUBLICATIONS

Patent Abstracts of Japan; English Abstract for JP 05-113667; May 7, 1993.
Patent Abstracts of Japan; English Abstract for JP 10-026828; Jan. 27, 1998.
Patent Abstracts of Japan; English Abstract for JP 09-073173; Mar. 18, 1997.
Patent Abstracts of Japan; English Abstract for JP 10-161313; Jun. 19, 1998.
Patent Abstracts of Japan; English Abstract for JP 09-090637; Apr. 4, 1997.
Patent Abstracts of Japan; English Abstract for JP 10-207069; Aug. 7, 1998.
Espace.net; English Patent Abstract for JP 2000-26446; Jan. 25, 2000.
Espace.net; English Patent Abstract for JP 2001-242627; Sep. 7, 2001.
Espace.net; English Patent Abstract for JP 2005-227332; Aug. 25, 2005.
Espace.net; English Patent Abstract for JP 2005-234015; Sep. 2, 2005.
Espace.net; English Patent Abstract for JP 2005-316259; Nov. 10, 2005.
Espace.net; English Patent Abstract for JP 2001-166481; Jun. 22, 2001.

* cited by examiner

Primary Examiner — Sin J. Lee
(74) Attorney, Agent, or Firm — Ware, Fressola, Maguire & Barber LLP

(57) ABSTRACT

[Task to Be Achieved]
To provide a chemically amplified type positive copolymer for semiconductor lithography, which has eliminated the problems of prior art, has a high development contrast, and has excellent resolution in fine-pattern formation; a composition for semiconductor lithography which contains the copolymer; and a process for producing the copolymer.
[Means for Achievement]
The copolymer for semiconductor lithography according to the present invention is a copolymer which has at least (A) a repeating unit having a structure which has an alkali-soluble group protected by an acid-labile, dissolution-suppressing group, (B) a repeating group having a lactone structure and (C) a repeating group having an alcoholic hydroxyl group and which is characterized by having an acid value of 0.01 mmol/g or less as determined by dissolving the copolymer in a solvent and subjecting the solution to neutralization titration with a solution of an alkali metal hydroxide using Bromothymol Blue as an indicator.

12 Claims, No Drawings

COPOLYMER AND COMPOSITION FOR SEMICONDUCTOR LITHOGRAPHY AND PROCESS FOR PRODUCING THE COPOLYMER

TECHNICAL FIELD

The present invention relates to a copolymer for lithography used in semiconductor production, a composition for semiconductor lithography containing the copolymer, and a process for producing the copolymer. More particularly, the present invention relates to a copolymer for semiconductor lithography used in the formation of fine pattern (e.g. resist film) employing a radiation such as deep-ultraviolet ray, X-ray, electron beam or the like; a composition for semiconductor lithography containing the copolymer; and a process for producing the copolymer.

BACKGROUND ART

In recent years, in the production of semiconductor device or liquid crystal display device, the pattern formed therein has become rapidly finer owing to the progress of lithography technique. In order to achieve a finer pattern, it is generally being pushed forward to use an exposure illuminant of shorter wavelength. Specifically explaining, an ultraviolet ray typified by i line has been used; however, currently, a krypton fluoride (KrF) excimer laser (wavelength: 248 nm) is used mainly in the mass production of the device and an argon fluoride (ArF) excimer laser (wavelength: 193 nm) is being introduced in the mass production. Further, researches are under way on lithography techniques using, as a ray source (a radiation source), a fluorine dimer ($F_2$) excimer laser (157 nm), an extreme ultraviolet ray (EUV), an electron beam (EB), etc.

In these lithography techniques, a chemically amplified positive type copolymer for lithography is used preferably. This copolymer has a repeating unit having a structure (hereinafter, this structure may be referred to as "acid-labile structure") which has a polar group soluble in an alkali developing solution (hereinafter, this polar group may be referred to as "alkali-soluble group"), protected by a substituent group unstable in an acid and suppressing the dissolution in an alkali developing solution (hereinafter, this substituent group may be referred to as "acid-labile, dissolution-suppressing group"), and a repeating unit having a polar group for enhancing the adhesivity to semiconductor substrate or the like and adjusting the solubility in lithography solvent or alkali developing solution.

For example, in a lithography using a KrF excimer laser as the illuminant, there are known copolymers having a hydroxystyrene-derived repeating unit, a repeating unit having a hydroxystyrene-derived phenolic hydroxyl group protected by an acid-labile, dissolution-suppressing group (e.g. acetal structure or tertiary hydrocarbon group), or, a repeating unit having an (α-alkyl)acrylic acid-derived carboxyl group protected by an acid-labile, dissolution-suppressing group (e.g. acetal structure or tertiary hydrocarbon group), and other group (see Patent Literatures 1 to 4, etc.). There are also known copolymers having a repeating unit having an alicyclic hydrocarbon group as an acid-labile, dissolution-suppressing group in order to obtain improvements in dry etching resistance and the difference in the dissolution rates in alkali developing solution before and after exposure (see Patent Literatures 5 to 6, etc.).

In a lithography using an ArF excimer laser of short wavelength or the like as an exposure illuminant, there have been studied copolymers having no hydroxystyrene-derived repeating unit having a high absorption constant to a wavelength of 193 nm, and there are known copolymers having a repeating unit of lactone structure, as a polar group for enhancing the adhesivity to semiconductor substrate or the like and adjusting the solubility in lithography solvent or alkali developing solution (see Patent Literatures 7 to 10, etc.).

Meanwhile, in recent years, a technique of immersion lithography has been proposed. It is a technique in which exposure is conducted by filling a liquid (e.g. water) having a higher refractive index than air, between an object glass and a thin lithography film. As compared with the conventional lithography (hereinafter, this may be referred to as "dry lithography") in which an air layer is present between an object glass and a thin film, the technique can enlarge the numerical aperture of lens for the same wavelength of ray source and can deepen the depth of focus for the same numerical aperture, and accordingly can form a finer pattern with the same wavelength of ray source. Therefore, immersion lithography using an ArF excimer laser as a ray source is being studied actively for practical use, and, as the copolymer used in the ArF immersion lithography, there is proposed the same copolymer as known in conventional ArF dry lithography (see Patent Literature 11 to 13, etc.).

In such a chemically amplified positive type copolymer for lithography, it is known that, when the acid value of a monomer (a raw material of polymerization) and a copolymer obtained by polymerization of the monomer is controlled at 200 mg-KOH/g (about 3.6 mmol/g) or less, the copolymer shows no change during storage and can form an intended pattern at a high accuracy (see Patent Literature 14). However, the lowest case of acid value reduction disclosed in the Patent Literature is 10 mg/KOH/g (about 0.2 mmol/g), and it has been unknown at all that, by reducing the acid value of copolymer to a level lower by at least one digit, there can be obtained a composition for semiconductor lithography superior in contrast of development rate to exposure energy (this contrast may hereinafter be referred to as development contrast and is a yardstick indicating the sharpness of resolution pattern).

Patent Literature 1: JP-A-1984-045439
Patent Literature 2: JP-A-1993-113667
Patent Literature 3: JP-A-1998-026828
Patent Literature 4: JP-A-1987-115440
Patent Literature 5: JP-A-1997-073173
Patent Literature 6: JP-A-1998-161313
Patent Literature 7: JP-A-1997-090637
Patent Literature 8: JP-A-1998-207069
Patent Literature 9: JP-A-2000-026446
Patent Literature 10: JP-A-2001-242627
Patent Literature 11: JP-A-2005-227332
Patent Literature 12: JP-A-2005-234015
Patent Literature 13: JP-A-2005-316259
Patent Literature 14: JP-A-2001-166481

DISCLOSURE OF THE INVENTION

Task to be Achieved by the Invention

The present invention has been made in view of the above-mentioned background art. The present invention aims at providing a chemically amplified type positive copolymer for semiconductor lithography, which has a high development contrast and has excellent resolution in fine-pattern formation; a composition for semiconductor lithography which contains the copolymer; and a process for producing the copolymer.

Means for Achieving the Task

The present inventors made a study in order to achieve the above task. As a result, it was found that the above task could be achieved by, in a copolymer having at least (A) a repeating unit having a structure which has an alkali-soluble group protected by an acid-labile, dissolution-suppressing group, (B) a repeating unit having a lactone structure and (C) a repeating unit having an alcoholic hydroxyl group, controlling the acid value of the copolymer to a level lower than in conventional copolymers, by analyzing with a method to determine the acid value accurately. The finding has led to the completion of the present invention.

The above task can be achieved by the following constitutions.

[1] A copolymer for semiconductor lithography, having at least (A) a repeating unit having a structure which has an alkali-soluble group protected by an acid-labile, dissolution-suppressing group, (B) a repeating group having a lactone structure and (C) a repeating group having an alcoholic hydroxyl group, the copolymer being characterized by having an acid value of 0.01 mmol/g or less as determined by dissolving the copolymer in a solvent and subjecting the solution to neutralization titration with a solution of an alkali metal hydroxide using Bromothymol Blue as an indicator.

[2] A copolymer for semiconductor lithography according to [1], wherein the acid-labile, dissolution-suppressing group of the repeating unit (A) is selected from a structure represented by the following formula (L1)

[formula 7]

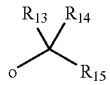

(L1)

{in the formula (L1), ○ is a bonding site of the acid-labile, dissolution-suppressing group, $R_{13}$ and $R_{14}$ are each independently a hydrocarbon group having 1 to 4 carbon atoms, $R_{15}$ is a hydrocarbon group having 1 to 12 carbon atoms, and $R_{15}$ may bond with $R_{13}$ or $R_{14}$ to form a ring}, or, a structure represented by the following formula (L2)

[formula 8]

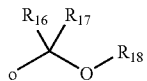

(L2)

{in the formula (L2), ○ is a bonding site of the acid-labile, dissolution-suppressing group, $R_{16}$ and $R_{17}$ are each independently a hydrogen atom or a hydrocarbon group having 1 to 4 carbon atoms, $R_{18}$ is a hydrocarbon group having 1 to 12 carbon atoms, and $R_{16}$ may bond with $R_{17}$ or $R_{18}$ to form a ring}.

[3] A copolymer for semiconductor lithography according to [2], wherein the repeating unit (A) has a structure represented by the following formula (A)

[formula 9]

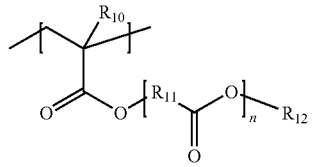

(A)

{in the formula (A), $R_{10}$ is a hydrogen atom or a hydrocarbon group having 1 to 4 carbon atoms, which may be substituted with fluorine atom, $R_{11}$ is an alicyclic hydrocarbon group having 6 to 12 carbon atoms, which may contain oxygen atom or sulfur atom, n is an integer of 0 or 1, and $R_{12}$ is an acid-labile, dissolution-suppressing group represented by the formula (L1) or (L2)}.

[4] A copolymer for semiconductor lithography according to any of [1] to [3], wherein the repeating unit (B) has a structure represented by the following formula (B)

[formula 10]

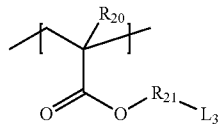

(B)

[in the formula (B), $R_{20}$ is a hydrogen atom or a hydrocarbon group having 1 to 4 carbon atoms, which may be substituted with fluorine atom, $R_{21}$ is a single bond or an alicyclic hydrocarbon group having 5 to 12 carbon atoms, which may contain oxygen atom or sulfur atom, L3 has a lactone structure represented by the following formula (L3)

[formula 11]

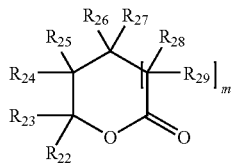

(L3)

{in the formula (L3), either one of $R_{22}$ to $R_{29}$ is a single bond having a bonding site as $R_{21}$, and the remainder of $R_{22}$ to $R_{29}$ is a hydrogen atom, or,
a hydrocarbon or alkoxy group having 1 to 4 carbon atoms, or, either one of $R_{22}$ to $R_{29}$ is a hydrocarbon group having 3 to 12 carbon atoms having a bonding site as $R_{21}$ and bonds with either one or two of the remainder of $R_{22}$ to $R_{29}$ to form an alicyclic ring having 5 to 15 carbon atoms and which may contain oxygen atom or sulfur atom, and the remainder of $R_{22}$ to $R_{29}$ is such that either one or two of the remainder is a single bond for forming the above-mentioned alicyclic ring having 5 to 15 carbon atoms and the rest of the remainder is a hydrogen atom, or, a hydrocarbon or alkoxy group having 1 to 4 carbon atoms, and m is an integer of 0 or 1}, and L3 is bonded with $R_{21}$ in one or two single bonds].

[5] A copolymer for semiconductor lithography according to any of [1] to [4], wherein the repeating unit (C) has a structure represented by the following formula (C)

[formula 12]

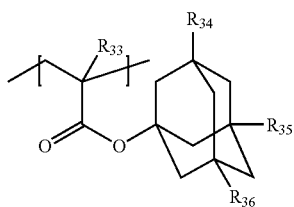

(C)

{in the formula (C), $R_{33}$ is a hydrogen atom or a hydrocarbon group having 1 to 4 carbon atoms, which may be substituted with fluorine atom, $R_{34}$ to $R_{36}$ are each independently a hydrogen atom or a hydroxyl group, and at least one of $R_{34}$ to $R_{36}$ is a hydroxyl group}.

[6] A composition for semiconductor lithography, characterized by comprising at least a copolymer according any of [1] to [5], a radiation-sensitive acid generator and an organic solvent.

[7] A composition for semiconductor lithography according to [6], which is used in dry lithography.

[8] A composition for semiconductor lithography according to [6], which is used in immersion lithography.

[9] A process for producing a copolymer for semiconductor lithography, having at least (A) a repeating unit having a structure which has an alkali-soluble group protected by an acid-labile, dissolution-suppressing group, (B) a repeating group having a lactone structure and (C) a repeating group having an alcoholic hydroxyl group, which process being characterized by dissolving, in an organic solvent, at least one monomer selected from a monomer giving the repeating unit (A), a monomer giving the repeating unit (B) and a monomer giving the repeating unit (C), contacting the resulting solution with water followed by giving rise to phase separation, and, thereafter, copolymerizing the monomers.

[10] A process for producing a copolymer for semiconductor lithography, having at least (A) a repeating unit having a structure which has an alkali-soluble group protected by an acid-dissociable dissolution-suppressing group, (B) a repeating group having a lactone structure and (C) a repeating group having an alcoholic hydroxyl group, which process being characterized by dissolving, in an organic solvent, at least one monomer selected from a monomer giving the repeating unit (A), a monomer giving the repeating unit (B) and a monomer giving the repeating unit (C), contacting the resulting solution with an ion exchange resin, and, thereafter, copolymerizing the monomers.

Advantages of the Invention

The present invention can provide a chemically amplified type positive copolymer for semiconductor lithography, which has a high development contrast and has excellent resolution in fine-pattern formation; a composition for semiconductor lithography which contains the copolymer; and a process for producing the copolymer. The present invention enables production of a semiconductor device of higher integration.

BEST MODE FOR CARRYING OUT THE INVENTION

The present invention is described in more detail below.
1. Structure of Copolymer The copolymer for semiconductor lithography of the present invention contains at least a repeating unit (A), a repeating unit (B) and a repeating unit (C).
(1) Repeating Unit (A)

The repeating unit (A) is a repeating unit having a structure having an alkali-soluble group protected by an acid-labile, dissolution-suppressing group and has a function of changing the solubility of the copolymer in an alkali developing solution. The alkali-soluble group is preferably a polar group having a pKa of 12 or less in water of 25° C., particularly preferably a polar group having a pKa of 10 or less in water of 25° C. As examples of the group, there can be mentioned phenolic hydroxyl group, fluoroalcoholic hydroxyl group, carboxyl group and sulfo group. Carboxyl group is particularly preferred in view of the transmittance of light (193 nm), storage stability, etc. The acid-labile, dissolution-suppressing group causes substitution with the hydrogen of the alkali-soluble group and is bonded with oxygen atom, whereby the solubility of copolymer in alkali developing solution is inhibited.

The acid-labile, dissolution-suppressing group preferably has a structure selected from the following formulas (L1) and (L2).

[Formula 13]

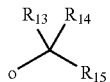

(L1)

In the formula (L1), ○ is a bonding site of the acid-labile, dissolution-suppressing group. $R_{13}$ and $R_{14}$ are each independently a hydrocarbon group having 1 to 4 carbon atoms, and, as specific examples thereof, there can be mentioned methyl group, ethyl group, n-propyl group, isopropyl group, n-butyl group and isobutyl group. $R_{15}$ is a hydrocarbon group having 1 to 12 carbon atoms, and, as specific examples thereof, there can be mentioned methyl group, ethyl group, n-propyl group, isopropyl group, n-butyl group, isobutyl group, cyclopentyl group, cyclohexyl group, norbornyl group, tricyclo[5.2.1.0$^{2,6}$]decanyl group, adamantyl group, and tetracyclo[4.4.0.1$^{2,5}$.1$^{7,10}$]dodecanyl group. Incidentally, $R_{15}$ may bond with $R_{13}$ or $R_{14}$ to form a ring, specifically a cyclopentane ring, a cyclohexane ring, a norbornane ring, a tricyclo [5.2.1.0$^{2,6}$]decane ring, an adamantane ring, a tetracyclo [4.4.0.1$^{2,5}$.1$^{7,10}$]dodecane ring or the like.

Especially when $R_{15}$ contains, per se or by bonding with $R_{13}$ or $R_{14}$, a ring, specifically a cyclopentane ring, a cyclohexane ring, a norbornane ring, a tricyclo[5.2.1.0$^{2,6}$]decane ring, an adamantane ring, a tetracyclo[4.4.0.1$^{2,5}$.1$^{7,10}$]dodecane ring or the like, the difference in the solubilities of copolymer in alkali developing solution before and after lithography is large, which is preferable for formation of fine pattern.

[Formula 14]

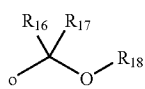

(L2)

In the formula (L2), ○ is a bonding site of the acid-labile, dissolution-suppressing group. $R_{16}$ and $R_{17}$ are each independently a hydrogen atom or a hydrocarbon group having 1 to 4 carbon atoms, and, as specific examples thereof, there can be mentioned hydrogen atom, methyl group, ethyl group, n-propyl group, isopropyl group, n-butyl group and isobutyl group. $R_{18}$ is a hydrocarbon group having 1 to 12 carbon atoms, and, as specific examples thereof, there can be mentioned methyl group, ethyl group, n-propyl group, isopropyl group, n-butyl group, isobutyl group, tert-butyl group, 2-ethylhexyl group, cyclopentyl group, cyclohexyl group, norbornyl group, tricyclo[5.2.1.0$^{2,6}$]decanyl group, adamantyl group, and tetracyclo[4.4.0.1$^{2,5}$.1$^{7,10}$]dodecanyl group. Incidentally, $R_{16}$ may bond with $R_{17}$ or $R_{18}$ to form a ring. As examples of the ring formed when $R_{16}$ has bonded with $R_{17}$, there can be mentioned cyclopentane ring, cyclohexane ring, norbornane ring, tricyclo[5.2.1.0$^{2,6}$]decane ring, adamantane ring and tetracyclo[4.4.0.1$^{2,5}$.1$^{7,10}$]dodecane ring; and, as specific examples of the ring formed when $R_{16}$ has bonded with $R_{18}$, there can be mentioned hydrofuran ring and hydropyran ring.

The repeating unit (A) preferably has a structure represented by the following formula (A).

[Formula 15]

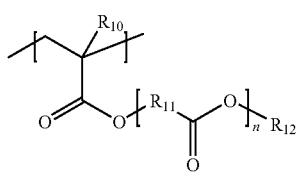

(A)

In the formula (A), $R_{10}$ is a hydrogen atom or a hydrocarbon group having 1 to 4 carbon atoms, which may be substituted with fluorine atom. As specific examples thereof, there can be mentioned hydrogen atom, methyl group, ethyl group, n-propyl group, isopropyl group, n-butyl group, isobutyl group and trifluoromethyl group. Preferred are hydrogen atom, methyl group and trifluoromethyl group.

$R_{11}$ is an alicyclic hydrocarbon group having 6 to 12 carbon atoms, which may contain oxygen atom or sulfur atom. As specific examples thereof, there can be mentioned norbornane group, tetracyclo[4.4.0.1$^{2,5}$.1$^{7,10}$]dodecane ring, 7-oxa-norbornane ring and 7-thia-norbornane ring. Preferred are norbornane ring and tetracyclo[4.4.0.1$^{2,5}$.1$^{7,10}$]dodecane ring. n is an inter of 0 or 1.

Specific examples of the repeating unit (A) are shown below. However, the repeating unit (A) of the present invention is not restricted to these examples. Incidentally, the monomers giving these repeating units may be used singly or in combination of two or more monomers.

[Formula 16]

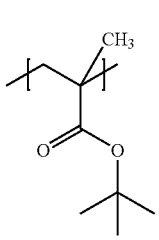

(A101)

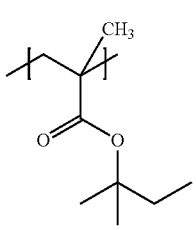

(A102)

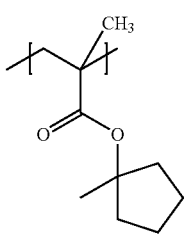

(A103)

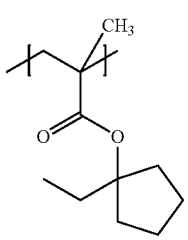

(A104)

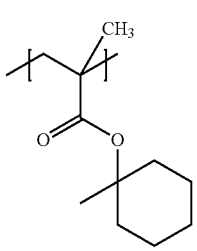

(A105)

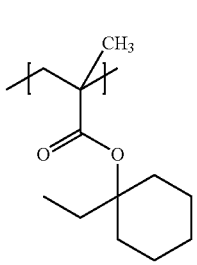

(A106)

(A107) 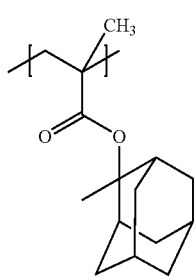
(A108) 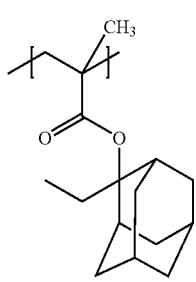
[Formula 17]
(A109) 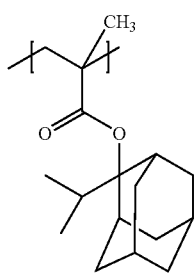
(A110) 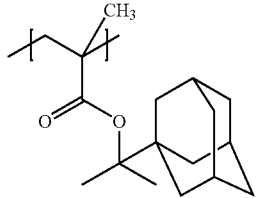
(A111) 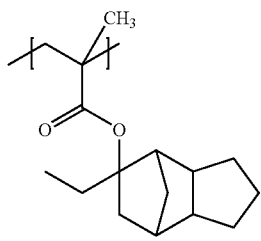
(A112) 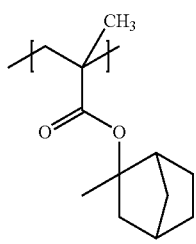
(A113) 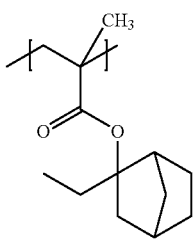
(A114) 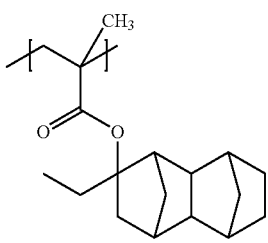
[Formula 18]
(A121) 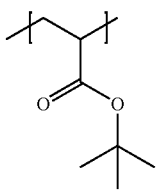
(A122) 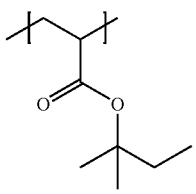
(A123) 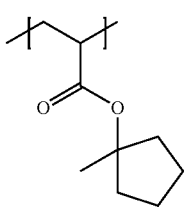
(A124) 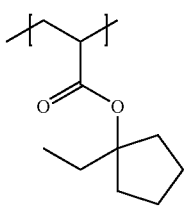
(A125)

-continued
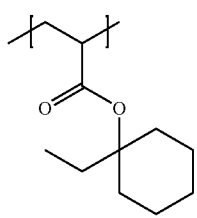 (A126)
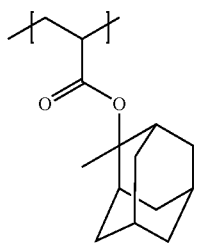 (A127)
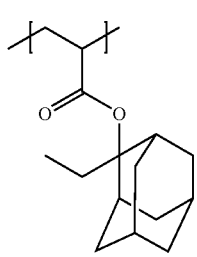 (A128)
[Formula 19]
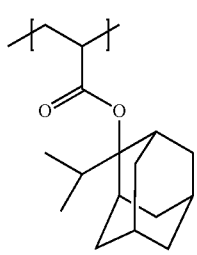 (A129)
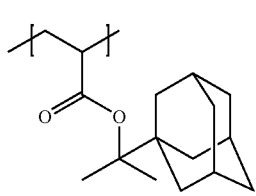 (A130)
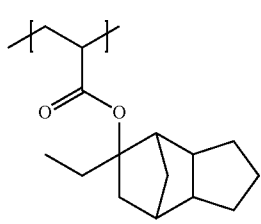 (A131)
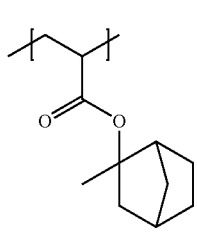 (A132)
-continued
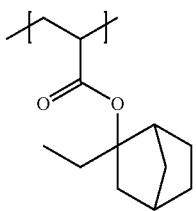 (A133)
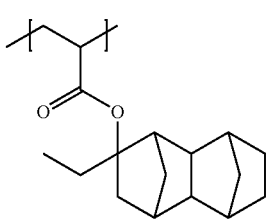 (A134)
[Formula 20]
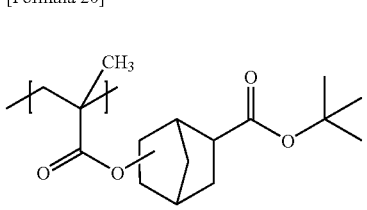 (A141)
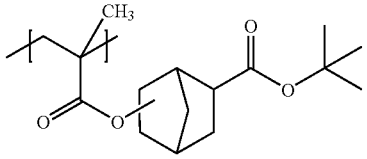 (A142)
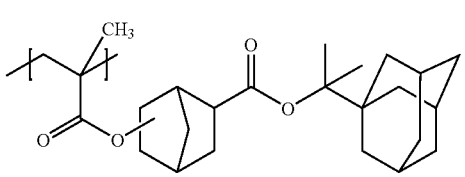 (A143)
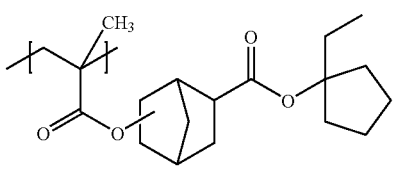 (A144)
[Formula 21]
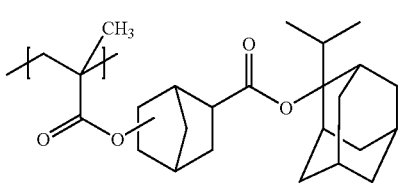 (A145)
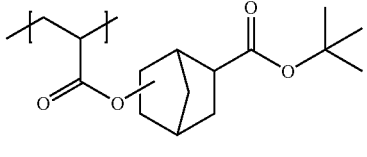 (A146)

(A147)
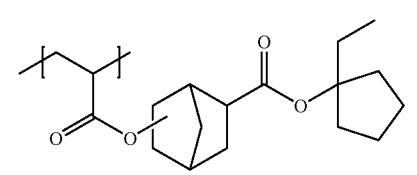
(A148)
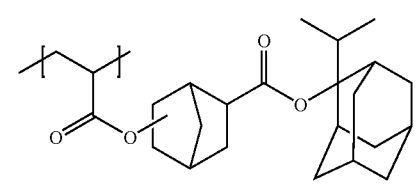
[Formula 22]
(A151)
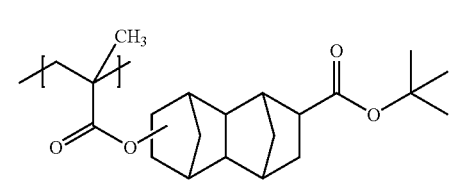
(A152)
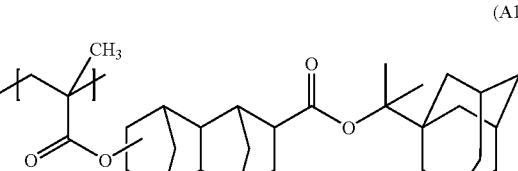
(A153)
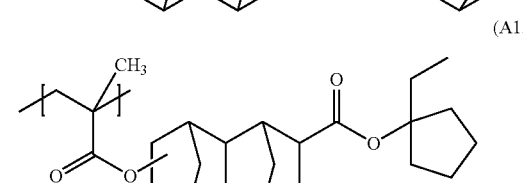
(A154)
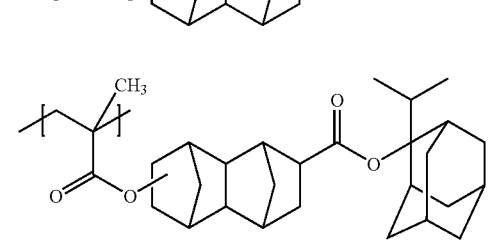
[Formula 23]
(A155)
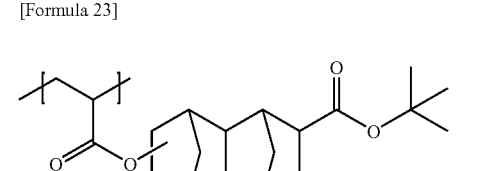
(A156)
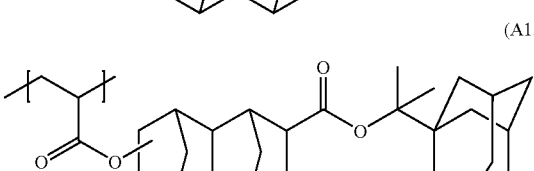
(A201)
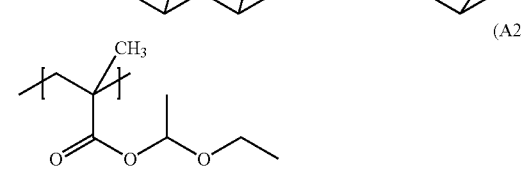
(A202)
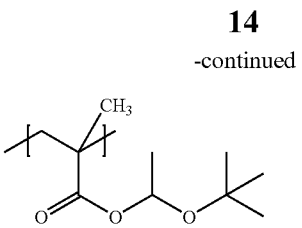
(A203)
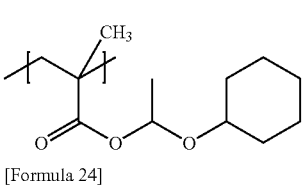
[Formula 24]
(A204)
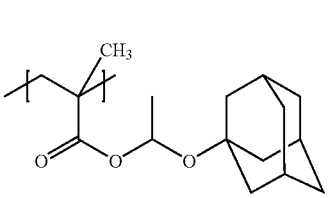
(A205)
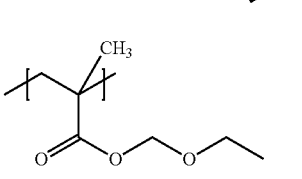
(A206)
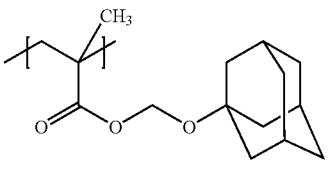
(A207)
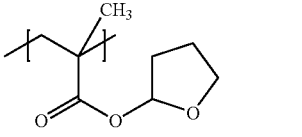
(A208)
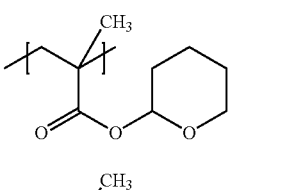
(A209)
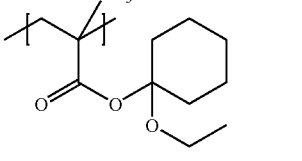
[Formula 25]
(A211)
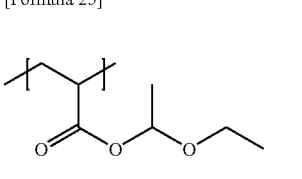
(A212)
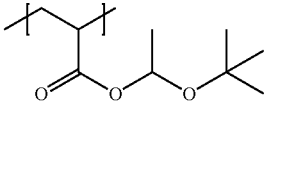

-continued

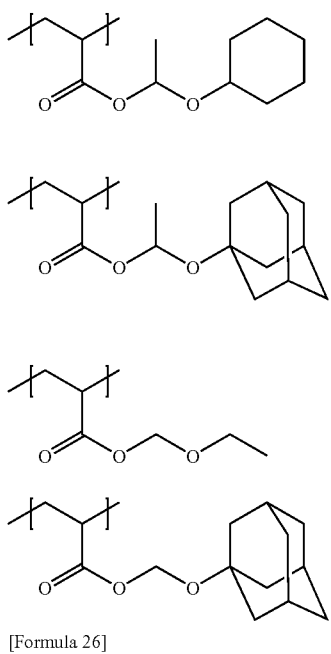

[Formula 26]

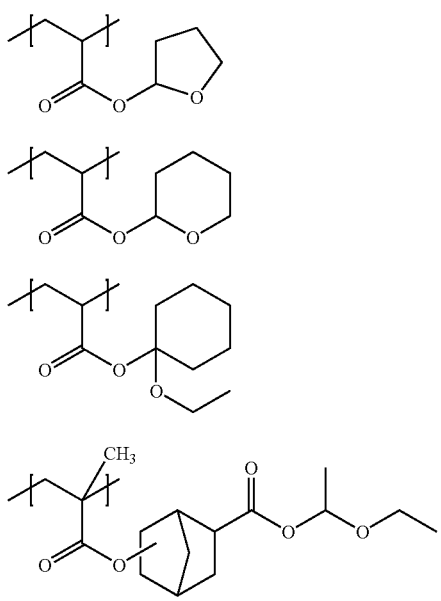

[Formula 27]

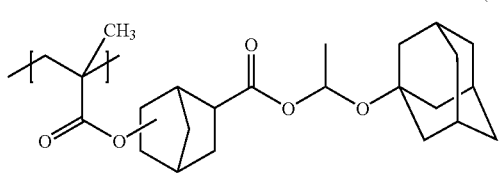

-continued

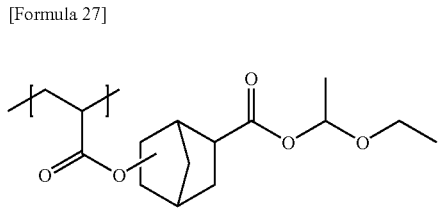

(2) Repeating Unit (B)

The repeating unit (B) is a repeating unit having a lactone structure and has a function of enhancing the adhesivity to semiconductor substrate and inhibiting the solubility of copolymer in lithography solvent or alkali developing solution. The repeating unit (B) preferably has a structure represented by the following formula (B).

[Formula 29]

(B)

In the formula (B), $R_{20}$ is a hydrogen atom or a hydrocarbon group having 1 to 4 carbon atoms, which may be substituted with fluorine atom. As specific examples thereof, there can be mentioned hydrogen atom, methyl group, ethyl group, n-propyl group, isopropyl group, n-butyl group, isobutyl group and trifluoromethyl group. Preferred are hydrogen atom, methyl group and trifluoromethyl group. $R_{21}$ is a single bond or an alicyclic hydrocarbon group having 5 to 12 carbon atoms, which may contain oxygen atom or sulfur atom. As specific examples thereof, there can be mentioned single bond or alicyclic hydrocarbon groups having a cyclohexane ring, a norbornane ring, a tetracyclo[4.4.0.1$^{2,5}$.1$^{7,10}$]dodecane ring, a 7-oxa-norbornane ring, a 7-thia-norbornane ring or the like. Preferred are single bond, norbornane ring and 7-oxa-norbornane ring.

In the formula (B), L3 is a lactone structure represented by the following formula (L3) and is bonded with $R_{21}$ in 1 or 2 single bonds.

[Formula 30]

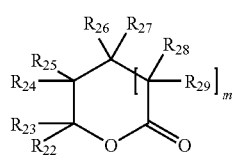
(L3)

In the formula (L3), either one of $R_{22}$ to $R_{29}$ is a single bond which is a bonding site as $R_{21}$, and the remainder of $R_{22}$ to $R_{29}$ is a hydrogen atom or a hydrocarbon or alkoxy group having 1 to 4 carbon atoms, or, either one of $R_{22}$ to $R_{29}$ is a hydrocarbon group having 3 to 12 carbon atoms which has a bonding site as $R_{21}$ and bonds with either one or two of the remainder of $R_{22}$ to $R_{29}$ to form an alicyclic ring having 5 to 15 carbon atoms and which may contain oxygen atom or sulfur atom, and the remainder of $R_{22}$ to $R_{29}$ is such that either one or two of the remainder is a single bond to form the above-mentioned alicyclic ring having 5 to 15 carbon atoms and the rest of the remainder is a hydrogen atom or a hydrocarbon or alkoxy group having 1 to 4 carbon atoms, and m is an integer of 0 or 1.

Specific examples of the repeating unit (B) are shown below. However, the repeating unit (B) of the present invention is not restricted to these specific examples. Incidentally, the monomers giving these repeating units can be used singly or in combination of two or more monomers.

[Formula 31]

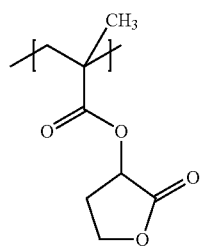
(B101)

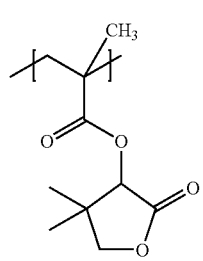
(B102)

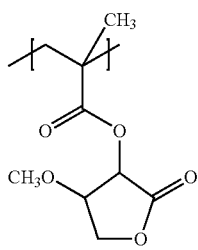
(B103)

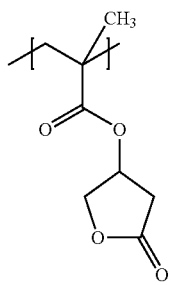
(B104)

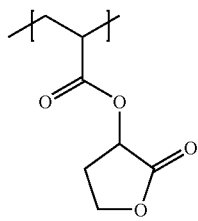
(B105)

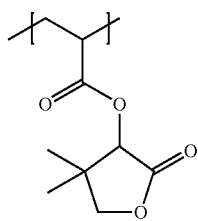
(B106)

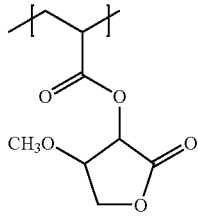
(B107)

(B108)

[Formula 32]
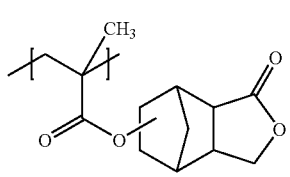 (B111)
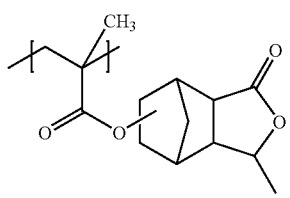 (B112)
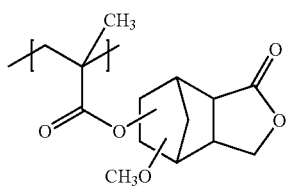 (B113)
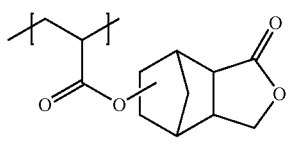 (B115)
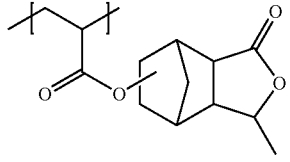 (B116)
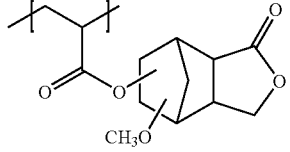 (B117)
[Formula 33]
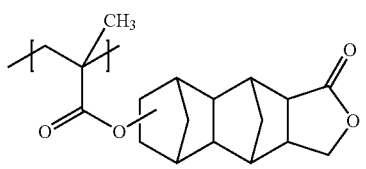 (B121)
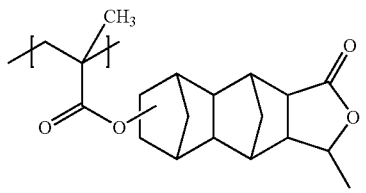 (B122)
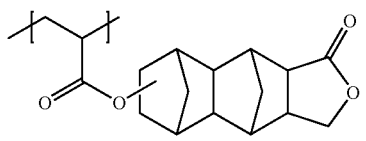 (B125)
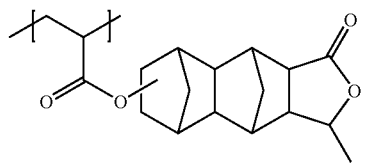 (B126)
[Formula 34]
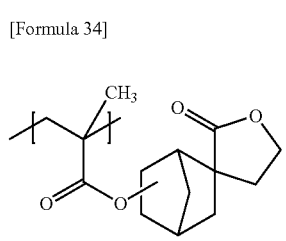 (B131)
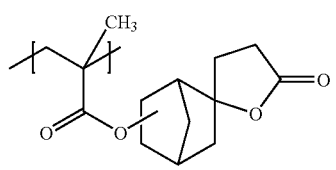 (B132)
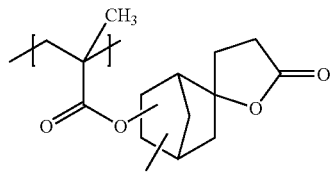 (B133)
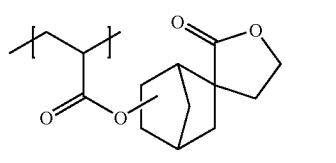 (B135)
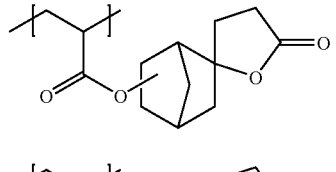 (B136)
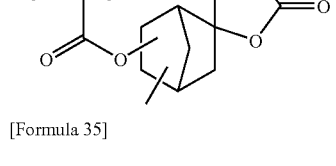 (B137)
[Formula 35]
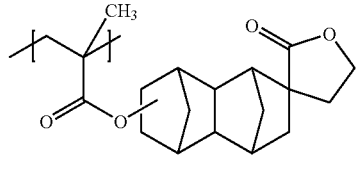 (B141)
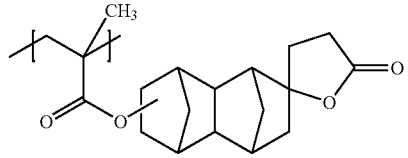 (B142)

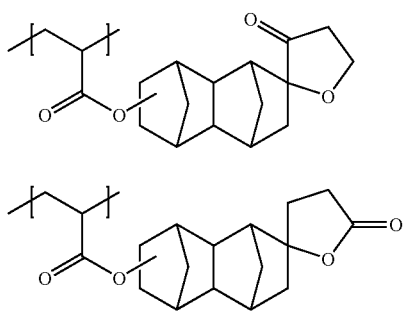 (B145)
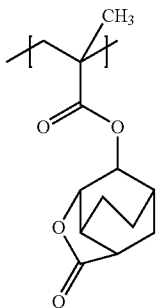 (B155)
(B146)
[Formula 36]
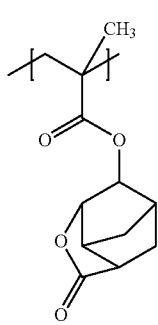 (B151)
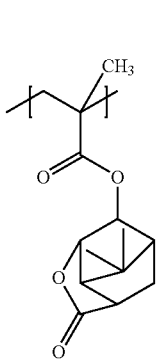 (B156)
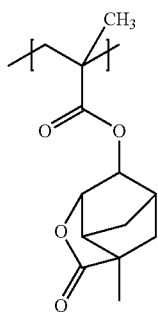 (B152)
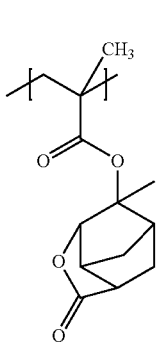 (B157)
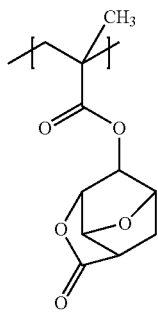 (B153)
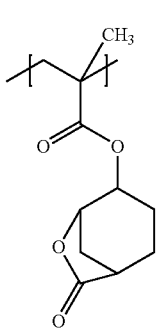 (B158)
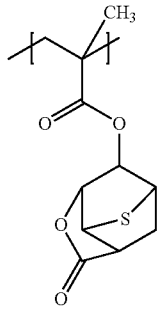 (B154)
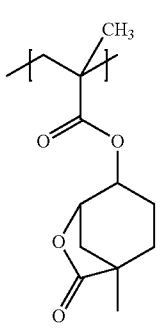 (B159)

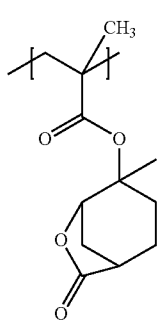 (B160)
[Formula 37]
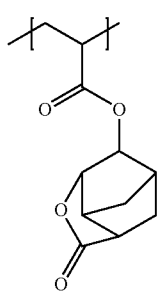 (B171)
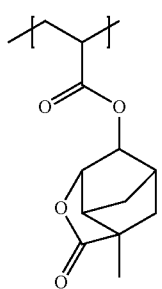 (B172)
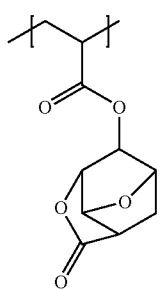 (B173)
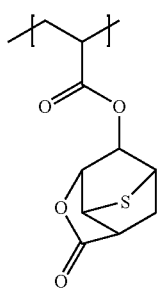 (B174)
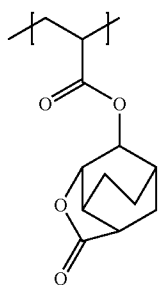 (B175)
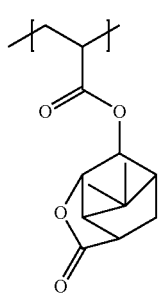 (B186)
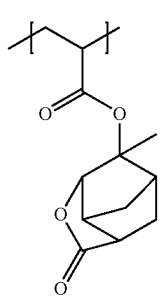 (B187)
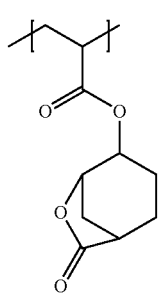 (B188)
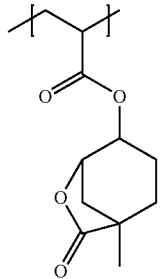 (B189)

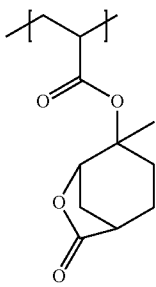
(B190)

(3) Repeating Unit (C)

The repeating unit (C) has an alcoholic hydroxyl group and has a function of enhancing the adhesivity to semiconductor substrate and inhibiting the solubility in lithography solvent or alkali developing solution. The structure of the repeating unit (C) is particularly preferred to be one represented by the following formula (C) for the excellency in light transmittance and etching resistance.

[Formula 38]

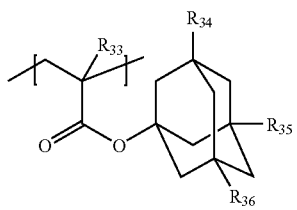
(C)

In the formula (C), $R_{33}$ is a hydrogen atom or a hydrocarbon group having 1 to 4 carbon atoms, which may be substituted with fluorine atom. As specific examples thereof, there can be mentioned hydrogen atom, methyl group, ethyl group, n-propyl group, isopropyl group, n-butyl group, isobutyl group and trifluoromethyl group. Preferred are hydrogen atom, methyl group and trifluoromethyl group. $R_{34}$ to $R_{36}$ are each independently a hydrogen atom or a hydroxyl group, and at least one of $R_{34}$ to $R_{36}$ is a hydroxyl group.

Specific examples of the repeating unit (C) are shown below. However, the repeating unit (C) of the present invention is not restricted to these specific examples. Incidentally, the monomers giving these repeating units may be used singly or in combination of two or more monomers.

[Formula 39]

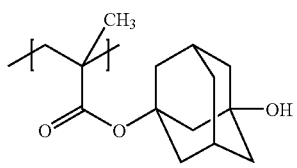
(C111)

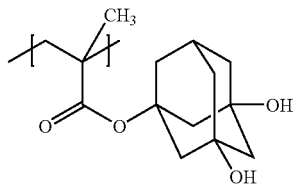
(C112)

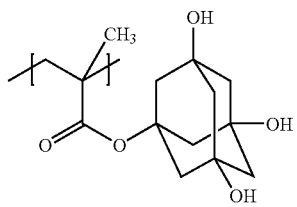
(C113)

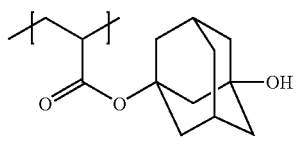
(C115)

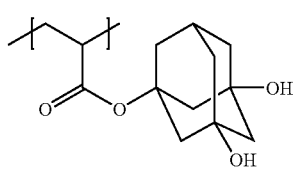
(C116)

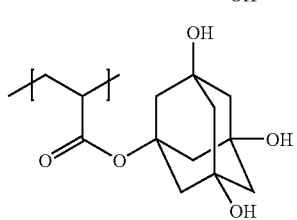
(C117)

(4) Other Repeating Units

The copolymer for semiconductor lithography of the present invention may contain as necessary, besides the above-mentioned repeating units, other repeating units such as repeating unit (D) having an acid-stable dissolution-suppressing group and the like, in order to inhibit the solubility in alkali developing solution and lithography solvent.

As examples of the repeating unit (D), a structure represented by the following formula (D) can be mentioned.

[Formula 40]

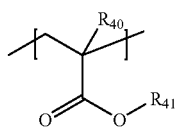
(D)

In the formula (D), $R_{40}$ is a hydrogen atom or a hydrocarbon group having 1 to 4 carbon atoms, which may be substituted with fluorine atom. As specific examples thereof, there can be mentioned hydrogen atom, methyl group, ethyl group, n-propyl group, isopropyl group, n-butyl group, isobutyl group and trifluoromethyl group. Preferred are hydrogen atom, methyl group and trifluoromethyl group. $R_{41}$ is an alicyclic hydrocarbon group having 1 to 12 carbon atoms, wherein the esterified carbon is a primary to tertiary carbon, or a 1-adamantatyl group. As specific examples thereof, there can be mentioned methyl group, ethyl group, n-propyl group, isopropyl group, n-butyl group, isobutyl group, cyclopentyl group, cyclohexyl group, 2-norbornyl group, 2-isobornyl group, 8-tricyclo[5.2.1.0$^{2,6}$]decanyl group, 1-adamantyl group, 2-adamantyl group and 4-tetracyclo[4.4.0.1$^{2,5}$.1$^{7,10}$] dodecanyl group.

Specific examples of the repeating unit (D) are shown below. However, the repeating unit (D) of the present invention is not restricted to these specific examples. Incidentally, the monomers giving these repeating units may be used singly or in combination of two or more monomers.

[Formula 41]

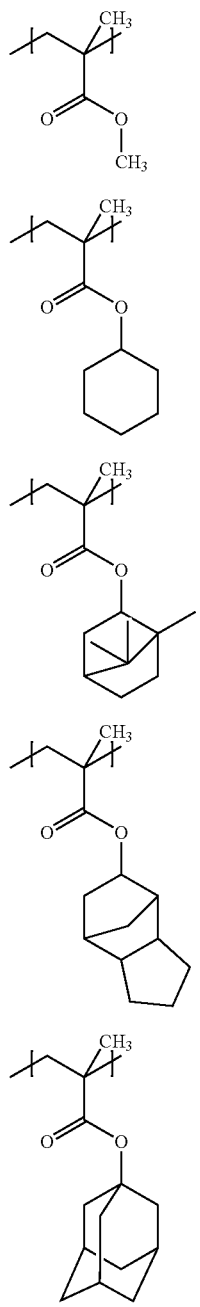

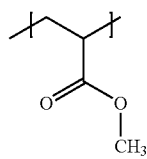

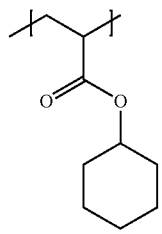

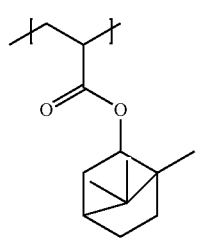

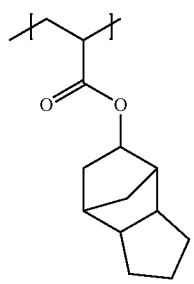

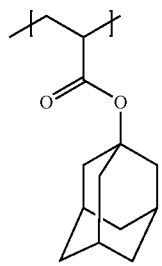

(5) Proportion of Each Repeating Unit

The proportion of each repeating unit can be selected in a range in which the basic properties in semiconductor lithography are not impaired. For example, as to the repeating unit (A), there are selected ordinarily 10 to 80 mol %, preferably 15 to 70 mol %, more preferably 20 to 60 mol %. As to the repeating unit (B), there are selected ordinarily 10 to 80 mol %, preferably 15 to 70 mol %, more preferably 20 to 60 mol %. As to the repeating unit (C), there are selected ordinarily 1 to 50 mol %, preferably 5 to 40 mol %, more preferably 10 to 30 mol %. As to the repeating unit (D), there are selected ordinarily 0 to 30 mol %, preferably 0 to 20 mol %, more preferably 0 to 10 mol %.

(6) Terminal Structure

The copolymer for semiconductor lithography of the present invention contains a known terminal structure. The copolymer ordinarily contains, as a polymerization initiating terminal, a structure derived from a radical polymerization initiator and, when a chain transfer agent is used, contains, as a polymerization initiating terminal, a structure derived from the chain transfer agent. When chain transfer occurs to a solvent, a monomer, or the like, the copolymer contains, as a polymerization initiating terminal, a structure derived from the solvent or the monomer. When the termination reaction is a recombination termination, the copolymer may contain polymerization initiating terminals at the two ends. In the case of disproportionation termination, the copolymer may contain a polymerization initiating terminal at one end and a terminal structure derived from a monomer at other end. When a polymerization terminator is used, the copolymer may contain a polymerization initiating terminal at one end and a terminal structure derived from the short-stop at other end. These multiple kinds of initiation reaction and termination reaction may occur in one polymerization reaction, in some cases and, in such cases, the copolymer obtained becomes a mixture of copolymers having different terminal structures. The polymerization initiator, chain transfer agent and solvent, usable in the present invention are described later.

(7) Molecular Weight and Polydispersity

When the weight-average molecular weight (Mw) of the present copolymer is too high, the copolymer is low in solubility in resist solvent and alkali developing solution and, when the weight-average molecular weight is too low, the properties of the resist film formed are inferior. Therefore, the weight-average molecular weight is preferably in a range of 1,000 to 40,000, more preferably in a range of 1,500 to 30,000, particularly preferably in a range of 2,000 to 20,000. Also, the molecular weight distribution (Mw/Mn) of the present copolymer is preferably in a range of 1.0 to 5.0, more preferably in a range of 1.0 to 3.0, particularly preferably in a range of 1.2 to 2.5.

The copolymer for semiconductor lithography of the present invention is characterized by having an acid value of 0.01 mmol/g or less as determined by a particular method.

2. Method for Determination of Acid Value

The acid value of the present copolymer is determined by dissolving a to-be-determined copolymer in a solvent and subjecting the resulting solution to neutralization titration with a solution of an alkali metal hydroxide using Bromothymol Blue as an indicator. This method is preferred particularly for the acid value determination of a copolymer having a lactone structure, for the following reason.

The lactone structure is hydrolyzed easily at a pH of 8 or higher. Further, when a weak acid (e.g. as carboxyl group) is neutralized with a strong base (e.g. an alkali metal hydroxide), the change of pH relative to the amount of titration is mild at pHs of lower than 7 and is maximum between pH 7 and pH 10. Therefore, it is necessary to use an indicator which causes color change at a pH between 7 and lower than 8, and Bromothymol Blue is the optimum indicator. The indicator causes color change at pH 7.6 from green (intermediate color) to blue (basic color).

Besides the above method, there can be mentioned, for example, a method using a potentiometric titration, a method by $^{13}$C-NMR, and a method by $^1$H-NMR. However, in the method using a potentiometric titration, the finding of end point is difficult and the base dropped in an excess amount causes the hydrolysis of lactone; therefore, the determination of acid is substantially difficult. Further, in the method by $^{13}$C-NMR, low S/N ratio makes difficult the determination of very small peaks and, in determination of carboxyl group, the peak separation of carboxyl group from the main chain carbonyl group of (meth)acrylate-based copolymer and the carbonyl group of lactone structure is difficult in many cases; for such reasons, the determination of acid is substantially difficult. Furthermore, in the method by $^1$H-NMR, the peak of acidic hydrogen is broad, making difficult the integration of very small peak areas; therefore, the determination of acid is substantially difficult.

The method of neutralization titration with a solution of alkali metal hydroxide using Bromothymol Blue as an indicator is explained below.

As the preferred alkali metal hydroxide used in titration, there can be mentioned sodium hydroxide and potassium hydroxide both used in ordinary neutralization titration. This alkali metal hydroxide is dissolved in water of a mixture of water and organic solvent in a concentration of preferably 0.0001 to 1 mol/liter, particularly preferably 0.001 to 0.1 mol/liter. The resulting titration solution is preferably determined for exact concentration, before use, by a method such as titration using a standard solution. The water used in the titration solution is preferably a water beforehand subjected to filtration by filter, in exchange, distillation, degassing or the like for impurities (e.g. carbon dioxide) reduction.

As the solvent for dissolving the copolymer prior to titration, there is selected a solvent which dissolves the copolymer and the indicator and which causes no separation—out of the copolymer when the titration solution is dropped into the copolymer solution. When the copolymer is water-soluble, there can be selected water, a water-soluble organic solvent or a mixture thereof, and water is preferred particularly. When the copolymer is insoluble in water, there is preferred an organic solvent which dissolves the copolymer and also dissolves water in an amount of preferably 1% or more, particularly preferably in an amount of 10% or more; and such organic solvents can be used singly or in admixture of two or more kinds.

As specific examples of the organic solvent, there can be mentioned ketones such as acetone, methyl ethyl ketone, methyl isoamyl ketone, methyl amyl ketone, cyclohexanone and the like; alcohols such as methanol, ethanol, isopropanol and the like; ether alcohols such as ethylene glycol monomethyl ether, ethylene glycol monoethyl ether, ethylene glycol mono-butyl ether, propylene glycol monomethyl ether, 3-methoxy-3-methyl-1-butanol and the like; ether esters which are esters compounds between the above-mentioned ether alcohol and acetic acid or the like; esters such as methyl acetate, ethyl acetate, butyl acetate, methyl propionate, methyl 3-methoxypropionate, ethyl 3-ethoxypropionate, methyl lactate, ethyl lactate, γ-butyrolactone and the like; ethers such as tetrahydrofuran, 1,4-dioxane, ethylene glycol dimethyl ether, diethylene glycol dimethyl ether and the like; aromatic hydrocarbons such as toluene, xylene and the like; amides such as N,N-dimethylformamide, N-methylpyrrolidone and the like; dimethyl sulfoxide; acetonitrile; and so forth.

3. Method for Production of Copolymer

The method for producing the copolymer for semiconductor lithography of the present invention is explained below. The copolymer of the present invention can be obtained at least via a step (Q) of removing an acid(s) from each monomer and a step (P) of radical-polymerizing the acid-removed monomers in a heated organic solvent to obtain a copolymer; and, as necessary, there can be combined thereto a step (R) of removing, from the copolymer, unnecessary substances such as unreacted substances (e.g. monomers and polymerization initiator), low-molecular components (e.g. oligomers) and the like, a step (S) of removing low-boiling point impurities and substituting the used solvent with a solvent suited for the next step or lithography, a step (T) of reducing the content of metal impurities undesirable for semiconductor formation, and a step (U) of reducing the substances (e.g. microgel) causing pattern defects.

(1) Step (Q)

The step (Q) is a step of removing, from each monomer, acidic substances such as acid raw material and acid catalyst used in the synthesis of monomer, acid generated as a by-product, and the like. When the acidic substances remain in the monomer, there occur, in the next step (P), partial detachment of the acid-labile, dissolution-suppressing group of the monomer giving the repeating unit (A) and, when the acidic substances are polymerizable substances, copolymerization of such acidic substances, inviting formation of acidic functional groups such as carboxyl group and the like, in the copolymer. In order to control the acid value of the copolymer at 0.01 mmol/g, it is preferred that the acidic substances contained in each monomer are removed and the acid value of each monomer is reduced to preferably 0.01 mg/g or less, particularly preferably 0.005 mg/g or less.

As to the method for removing the acidic substances, there is no particular restriction as long as the acid value of the monomer can be reduced to 0.01 mg/g or less. However, as preferred methods, there can be mentioned, for example, (Q1) a method of dissolving the monomer in an organic solvent which gives rise to phase separation when mixed with water, adding water to the resulting solution to extract the acidic components into an aqueous phase, and separating and removing the aqueous phase, and (Q2) a method of contacting the monomer dissolved in an organic solvent, with an ion exchange resin to allow the ion exchange resin to adsorb the acidic components in the monomer or cause ion exchange, to remove the acidic components.

As the organic solvent used in the step (Q1), there is selected, from the above-mentioned solvents, a solvent which dissolves the monomer but separates from water. Such a solvent can be used singly or in admixture of two or more kinds. The concentration of the monomer is selected in a range of ordinarily 5 to 80% by mass, preferably 10 to 70% by mass, particularly preferably 15 to 50% by mass, because too high a concentration reduces the efficiency of extraction of acidic components and too low a concentration results in low productivity. The amount of water which is an extraction solvent, is selected in a range of ordinarily 0.1 to 10 times, preferably 0.2 to 5 times, particularly preferably 0.3 to 3 times to the mass of monomer solution, because too small a water amount causes insufficient extraction of acidic components and too large a water amount results in low productivity. The temperature of extraction is selected in a range of ordinarily 0 to 60° C., preferably 5 to 50° C., particularly preferably 10 to 40° C., because too high a temperature results in inferior phase separation and the deterioration of monomer and solvent and too low a temperature invites solidification of water.

As the organic solvent used in the step (Q2), there is selected, from the above-mentioned solvents, a solvent which dissolves the monomer. As the ion exchange resin, there can be used a resin which is ordinarily called anion exchange resin and which has anion adsorption ability and anion exchange ability, singly or in combination of two or more kinds. Also, an anion exchange resin may be used in combination with a resin which is ordinarily called cation exchange resin and which has cation exchange ability. Incidentally, since basic components may dissolve out from the anion exchange resin, it is particularly preferred that the anion exchange resin is used in combination with a cation exchange resin.

As examples of the anion exchange resin, there can be mentioned resins such as polystyrene, (meth)acrylate-divinylbenzene copolymer, styrene-divinylbenzene copolymer, polystyrene crosslinked with alkylene group, (meth)acrylate-divinylbenzene copolymer crosslinked with alkylene group, styrene-divinylbenzene copolymer crosslinked with alkylene group, and the like, all having a substituent group having anion adsorption ability or anion exchange ability. As examples of the substituent group having anion adsorption ability, there can be mentioned substituent groups having a primary, secondary or tertiary amino group, and, as specific examples thereof, there can be mentioned N-dimethylaminomethyl group, N-methylaminomethyl group, aminomethyl group and N,N-diethylaminomethyl group. N,N-dimethylaminomethyl group is preferred particularly. As an example of the substituent having anion adsorption ability, substituent groups having quaternary ammonium ion can be mentioned; and the counter cation is preferably hydroxyl anion and, as specific examples thereof, there can be mentioned the following ions (E1) to (E4) with (E1) or (E2) being preferred particularly.

[Formula 42]

As the cation exchange resin, there can be mentioned resins which have, in the above-mentioned anion exchange resin, a functional group (e.g. carboxylic acid or sulfonic acid) having cation exchange ability in place of the functional group having anion adsorption ability or anion exchange ability. A resin substituted with sulfonic acid group is preferred particularly.

The contact of the monomer-dissolved solution with the ion exchange resin may be conducted by adding the ion exchange resin into the monomer solution, followed by stirring, or by passing the monomer solution through an ion exchange layer filled with the ion exchange resin. The use amount of the ion exchange resin is selected in such a range that the ion exchange capacity becomes ordinarily 1.2 to 100 equivalents, preferably 1.5 to 50 equivalents, particularly 1.5 to 20 equivalents relative to the acidic substances contained in the monomer, because too small an amount is unable to remove the acidic substances sufficiently and too large an amount results in low productivity.

When the monomer solution is passed through the ion exchange layer, the LHSV (this is an abbreviation of Liquid Hourly Space Velocity and indicates the space velocity of a fluid. Here, it is a value obtained by dividing the passing velocity of the monomer solution by the volume of the ion exchange layer) is selected in a range of ordinarily 0.1 to 100/hr, preferably 0.5 to 50/hr, particularly preferably 1 to 20/hr, because too large an LHSV results in reduced efficiency of removal of acidic substances and too small an LHSV results in low productivity.

The height of the ion exchange layer is selected in a range of ordinarily 5 to 500 cm, preferably 10 to 300 cm, particularly preferably 20 to 200 cm, because too small a height results in reduced efficiency of removal of acidic substances owing to short pass and too large a height results in difficulty of monomer solution passing owing to differential pressure. The temperature is selected in a range of ordinarily 0 to 60° C., preferably 5 to 50° C., particularly preferably 10 to 40° C., because too high a temperature causes the deterioration of the ion exchange resin, the monomer and the solvent and too low a temperature results in insufficient ion exchange or ion adsorption.

After the above removal of acidic substances, each monomer solution may be used per se in the next step (P); however, preferably, the monomer is separated from the solvent, for example, by heating the monomer solution under reduced pressure to distil off the organic solvent, and then is used in the step (P).

(2) Step (P)

The step (P) is a step of radical-polymerizing monomers in the presence of a radical polymerization initiator in an organic solvent, and it can be carried out by a known method. As examples of the method, there can be mentioned (P1) a mixture-heating up method of dissolving monomers and a polymerization initiator in a solvent and heating the solution to give rise to polymerization, (P2) a mixture-dropping method of dissolving, if necessary, monomers and a polymerization initiator in a solvent and then dropping the mixture into a hot solvent to give rise to polymerization, (P3) an independent dropping method of independently dissolving, if necessary, monomers and a polymerization initiator in a solvent and then dropping them independently into a hot solvent to give rise to polymerization, and (P4) an initiator-dropping method of dissolving monomers in a solvent, heating the solution, and dropping thereinto a polymerization initiator dissolved in a solvent, to give rise to polymerization.

Unreacted monomers of high concentration may come in contact with a radical of low concentration, in the polymerization system in the mixture-heating up method (P1) and the initiator-dropping method (P4) or in the dropping solution tank in the mixture-dropping method (P2); therefore, in these methods, there is a tendency of easy formation of high-molecular compounds (high polymers) having a molecular weight of 100,000 or more, which is one cause of pattern defect generation. In contrast, in the independent dropping method (P3), there is no co-presence of monomers and polymerization initiator in dropping solution tank and, when the monomers have been dropped into the polymerization system, the concentration of unreacted monomers is kept low; therefore, there is no formation of high polymers and the independent dropping method (P3) is particularly preferred as the polymerization method of the present invention. Incidentally, in the mixture-dropping method (P2) and the independent dropping method (P3), there may be changed, with the passage of dropping time, the proportions of monomers, the ratio of monomers, polymerization initiator and chain transfer agent, etc.

As the polymerization initiator, there can be used a known radical polymerization initiator. Preferred are radical polymerization initiators such as azo compound, peroxide and the like. As specific examples of the azo compound, there can be mentioned 2,2'-azobisisobutyronitrile, 2,2'-azobis(2-methylbutyronitrile), dimethyl-2,2'-azobisisobutyrate, 1,1'-azobis (cyclohexane-1-carbonitrile) and 4,4'-azobis(4-cyanovaleric acid). As specific examples of the peroxide, there can be mentioned decanoyl peroxide, lauroyl peroxide, benzoyl peroxide, bis(3,5,5-trimethylhexanoyl) peroxide, succinic acid peroxide, tert-butyl peroxy-2-ethylhexanoate, tert-butyl peroxypivalate and 1,1,3,3-tetramethylbutyl peroxy-2-ethylhexanoate. They can be used singly or in admixture. The use amount of the polymerization initiator can be determined depending upon the desired Mw of copolymer obtained, the kinds and ratio of raw material monomers, polymerization initiator, chain transfer agent and solvent, and the polymerization conditions such as polymerization temperature, dropping rate and the like.

A chain transfer agent can be used as necessary and a known chain transfer agent can be used. As the chain transfer agent, a thiol compound is preferred and a thiol compound can be selected widely from known thiol compounds. Specifically, there can be mentioned tert-dodecylmercaptan, mercaptoethanol, mercaptoacetic acid, mercaptopropionic acid, etc. A thiol compound having a structure in which a 2-hydroxy-1,1,1,3,3,3-hexafluoro-2-propylidene group is bonded to a saturated hydrocarbon, is preferred particularly because it can reduce the roughness and defect of lithography pattern.

The use amount of the chain transfer agent can be determined depending upon the desired Mw of copolymer obtained, the kinds and ratio of raw material monomers, polymerization initiator, chain transfer agent and solvent, and the polymerization conditions such as polymerization temperature, dropping rate and the like. In the mixture-heating up method (P1), the chain transfer agent can be dissolved in a solvent together with the monomers and the polymerization initiator and the solution can be heated; in the mixture-dropping method (P2), the independent dropping method (P3) and the initiator-dropping method (P4), the chain transfer agent may be mixed with the monomers and dropped, or may be mixed with the polymerization initiator and dropped, or may be dissolved in a hot solvent and used.

As to the polymerization solvent, there is no particular restriction as long as it is a compound capable of dissolving the monomers, the polymerization initiator, the chain transfer agent and the copolymer formed by polymerization. As specific examples of the polymerization solvent, there can be mentioned the organic solvents mentioned above as examples of the solvent usable in the determination of the acid value, and they can be used singly or in admixture of two or more kinds.

The polymerization temperature of the step (P) can be determined appropriately depending upon the boiling points of the solvent, the monomers, the chain transfer agent, etc., the half-life temperature of the polymerization initiator, etc. When the polymerization temperature is low, the polymerization does not proceed satisfactorily, posing a problem in productivity. When the polymerization temperature is higher than required, there is a problem in the stabilities of the monomers and the copolymer formed. Therefore, the polymerization temperature is selected in a range of preferably 40 to 120° C., particularly preferably 60 to 100° C.

As to the dropping time in the mixture-dropping method (P2) and the independent dropping method (P3), a shot dropping time is not preferred because it tends to give a wide molecular weight distribution and the dropping of the solution in a large amount in a short time incurs a reduction in the temperature of polymerization solution. Meanwhile, a long dropping time is not preferred because the copolymer undergoes more-than-required thermal history and there is a reduction in productivity. Therefore, the dropping time is selected in a range of ordinarily 0.5 to 24 hours, preferably 1 to 12 hours, particularly preferably 2 to 8 hours.

After the completion of the dropping in the mixture dropping method (P2) and the independent dropping method (P3) and also after the temperature elevation up to the polymerization temperature in the mixture-heating up method (P1) and the initiator dropping method (P4), it is preferred that aging is conducted, for example, by keeping the system temperature at a constant level or by increasing the system temperature further, to react the remaining unreacted monomers. Too long an aging time is not preferred because it invites low productivity per hour and the copolymer undergoes more-than-required thermal history. Therefore, the aging time is selected ordinarily within 12 hours, preferably within 6 hours, particularly preferably in a range of 1 to 4 hours.

(3) Step (R)

The step (R) is a step of removing, by solvent extraction, the unreacted substances (e.g. monomers and polymerization initiator) and the low-molecular components (e.g. oligomers), contained in the copolymer obtained after the step (P). As the method for conducting the step (R), there can be mentioned, for example, (R1) a method of adding a poor solvent to precipitate the copolymer and then separating the solvent phase, (R1a) a method of, after the method (R1), adding a poor solvent to clean the copolymer and then separating the solvent phase, (R1b) a method of, after the method (R1), adding a good solvent to re-dissolve the copolymer, adding further a poor solvent to re-precipitate the copolymer and then separating the solvent phase, (R2) a method of adding a poor solvent to form a poor solvent phase and a good solvent phase and separating the poor solvent phase, and (R2a) a method of, after the method (R2), adding a poor solvent to clean the good solvent phase and then separating the poor solvent phase. Incidentally, the method (R1a), the method (R1b) and the method (R2a) may be repeated, or combined.

As to the poor solvent, there is no particular restriction as long as it is a solvent in which the copolymer is hardly soluble. There can be used, for example, water; alcohols such as methanol, isopropanol and the like; and saturated hydrocarbons such as hexane, heptane and the like. As to the good solvent, there is no particular restriction as long as it is a solvent which can dissolve the copolymer easily. The good solvent can be used singly or as a mixed solvent of two or more kinds. The good solvent is preferably the same as the polymerization solvent for the control of the production steps. As examples of the good solvent, there can be mentioned the solvents mentioned as examples of the polymerization solvent used in the step (P).

(4) Step (S)

The step (S) is a step of removing the low-boiling impurities contained in the copolymer solution or substituting the solvent in the copolymer solution with a solvent suitably used in the next step or in the lithography composition to be prepared later. The step (S) can be conducted, for example, by a step (S1) of concentrating the polymer solution with heating under reduced pressure and, as necessary, adding a solvent and conducting further concentration, and a step (S2) of, as necessary, concentrating the polymer solution with heating under reduced pressure, then, with feeding a solvent preferred for use in the next step or in the lithography composition to be prepared later, distilling off the initial solvent and the fed solvent, and further conducting concentration as necessary to substitute the initial solvent with the solvent preferred for use in the next step or in the lithography composition to be prepared later.

The step (S) is conducted, for example, when the solvent of the lithography composition is different solvent from the solvent present after the step (P) or the step (R) or when undesired impurities are present in the lithography composition, and the step (S) is preferably conducted prior to the step (U) of preparing a lithography composition.

It is possible to omit the step (S) and conduct vacuum drying to once obtain a solid, followed by dissolving the solid in a different solvent. However, this operation is not preferred because the impurities and the solvent tend to remain in the solid and moreover the copolymer undergoes more-than-required thermal history.

As to the temperature of the step (S), there is no particular restriction as far as the temperature is free from the deterioration of copolymer. However, the temperature is ordinarily preferred to be 100° C. or less, more preferred to be 80° C. or less, further preferred to be 70° C. or below, particularly preferred to be 60° C. or less. As to the amount of the solvent fed later in the case of solvent substitution, too small an amount is not preferred because the removal of low-boiling compounds is not sufficient and too large an amount is not preferred because a long time is taken and the copolymer undergoes more-than-required thermal history. The amount of the solvent can be selected in a range of ordinarily 1.05 to 10 times, preferably 1.1 to 5 times, particularly preferably 1.2 to 3 times the solvent amount required in finished solution.

(5) Step (T)

The step (T) is a step of reducing the metal content contained in the copolymer solution, which is not preferred in semiconductor lithography. The metal may come into the copolymer solution from the raw materials, subsidiary materials, equipment and apparatus and other environments. Since the metal content may surpass the limit allowed in semiconductor formation, the step (T) is carried out as necessary. In the step (R), when the polar solvent is a poor solvent, the metal content may be reduced; in such a case, the step (R) can function also as the step (T). As other methods, there can be selected, for example, (T1) a method of contacting the polymer solution with a cation exchange resin, (T2) a method of contacting the polymer solution with a mixed resin of a cation exchange resin and an anion exchange resin or an acid adsorption resin, and (T3) a method of passing the polymer solution through a filter containing a substance having a positive zeta potential (e.g. polyamidopolyamineepichlorohydrin cation resin). These steps can be used in combination. As examples of the filter used in the step (T3), there can be mentioned Zeta Plus 40 QSH, Zeta Plus 020 GN and Electropore EF 11 (they are trademarks and the same applies to hereinafter), which are products of Cuno K.K.

(6) Step (U)

The step (U) is a step of passing the copolymer dissolved in an organic solvent, through a filter to reduce a microgel of high polymer, etc. which cause pattern defect and are not preferred. The filtration accuracy of the filter is 0.2 µm or less, preferably 0.1 µm or less, particularly preferably 0.05 µm or less. As the material for the filter, there can be mentioned a polyolefin (e.g. polyethylene or polypropylene), a polar group-containing resin (e.g. polyamide, polyester or polyacrylonitrile), and a fluorine-containing resin (e.g. polyethylene fluoride). A polyamide is preferred particularly.

As examples of the polyamide type filter, there can be mentioned Ultipleats P-Nylon66 and Ultipore N66 (products of PALL Corporation), and Photoshield and Electropore 11 EF (products of Cuno K.K.). As examples of the polyethylene type filter, there can be mentioned Microguard Plus HC 10 and Optimizer D (products of Entegris, Inc.). These filters may be used singly or in combination of two or more kinds.

(7) Step (V)

The copolymer obtained as above can be made into a chemically amplified type resist composition by dissolving the dried solid in at least one kind of lithography solvent or, as necessary, diluting the copolymer dissolved in a lithography solvent, with the same or different lithography solvent, and adding thereto a radiation-sensitive acid generator (X) [hereinafter, referred to as component (X)], an acid diffusion-inhibitive agent (e.g. nitrogen-containing organic compound) for preventing the diffusion of acid into the area not exposed to a radiation [hereinafter, this agent is referred to as component (Y)] and, as necessary, other additive (Z) [hereinafter, referred to as component (Z)].

The lithography solvent may be any solvent as long as it can dissolve each component constituting the lithography composition to give a uniform solution. As the lithography solvent, a single solvent or a mixed solvent can be selected freely from known solvents for chemically amplified type resist. Ordinarily, the lithography solvent can be selected from the solvents shown as examples of the polymerization solvent of step (P) and the good solvent of step (R), in consideration of the solubility for composition components other than copolymer, the viscosity, the boiling point, the absorbability of the radiation used in lithography, etc. Particularly preferred resist solvents are methyl amyl ketone, cyclohexanone, ethyl lactate (EL), γ-butyrolactone and propylene glycol monomethyl ether acetate (PGMEA). A mixed solvent of PGMEA and other polar solvent is preferred particularly. As the polar solvent mixed with PGMEA, EL is preferred particularly.

The amount of the lithography solvent contained in the lithography composition is not restricted particularly but is ordinarily determined appropriately so that the composition has a concentration suitable for coating onto substrate or the like and a viscosity appropriate for the intended thickness of coating film formed. Generally, the solvent is used so that the solid content of lithography composition is in a range of 2 to 20% by mass, preferably 5 to 15% by mass.

The component (X) can be appropriately selected from radiation-sensitive acid generators which have hitherto been proposed for use in chemically amplified type resist. As examples of such agents, there can be mentioned onium salts such as iodonium salt, sulfonium salt and the like; oxime sulfonates; diazomethanes such as bisalkyl or bisaryl sulfonyl diazomethane and the like; nitrobenzyl sulfonates; iminosulfonates; and disulfones. Of these, preferred is an onium salt having a fluorinated alkylsulfonic acid ion as an anion. They may be used singly or in combination of two or more kinds. The component (X) is used in a range of ordinarily 0.5 to 30 parts by mass, preferably 1 to 10 parts by mass relative to 100 parts by mass of the copolymer.

The component (Y) can be appropriately selected from acid diffusion-inhibitive agents which have hitherto been proposed for use in chemically amplified type resist. As examples of such agents, nitrogen-containing organic compounds can be mentioned. Primary, secondary or tertiary alkylamines or hydroxyalkylamines are preferred. In particular, tertiary alkylamines and tertiary hydroxyalkylamines are preferred and, of them, triethanolamine and triisopropanolamine are preferred particularly. They may be used singly or in combination of two or more kinds. The component (Y) is used in a range of ordinarily 0.01 to 5.0 parts by mass relative to 100 parts by mass of the copolymer.

As other additive [component (Z)], there can be appropriately added, as necessary, the following compounds conventionally used as lithography additives. That is, organic carboxylic acid or oxo acid of phosphorus, for prevention of sensitivity deterioration of acid generator or improvements in lithography pattern formability, delaytime stability, etc.; additional resin for improvement of resist film properties; surfactant for improvement of coatability; dissolution-suppressing agent; plasticizer; stabilizer; coloring agent; halation inhibitor; dye; and so forth. As examples of the organic carboxylic acid, there can be mentioned malonic acid, citric acid, malic acid, succinic acid, benzoic acid and salicylic acid. They can be used singly or in admixture of two or more kinds. The organic carboxylic acid is used in a range of 0.01 to 5.0 parts by mass relative to 100 parts by mass of the copolymer.

EXAMPLES

Next, the present invention is described further by way of Examples. However, the present invention is in no way restricted by these Examples. In the following Examples, the abbreviations used have the following meanings.

Monomers
　　Monomer G: γ-butyrolacton-2-yl methacrylate
　　Monomer Ma: 2-methyl-2-adamantyl acrylate
　　Monomer Oa: 3-hydroxy-1-adamantyl acrylate
Repeating Units
　　G: a repeating unit derived from monomer G
　　Ma: a repeating unit derived from monomer Ma
　　Oa: a repeating unit derived from monomer Oa

[Formula 43]

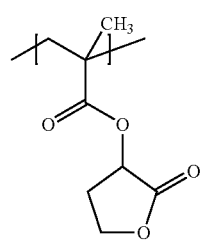

G

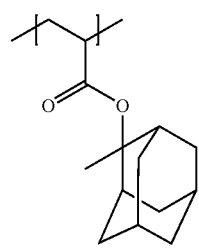

Ma

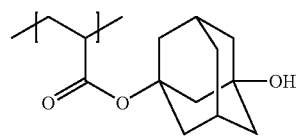

Oa

Polymerization Initiator
　　MAIB: dimethyl-2,2'-azobisisobutylate
Solvents
　　MEK: methyl ethyl ketone
　　THF: tetrahydrofuran
　　PGMEA: propylene glycol monomethyl ether acetate
　　EL: ethyl lactate
(1) Measurement of Mw and Mw/Mn of copolymer (GPC)
　　Measured by GPC. The analytical conditions were as follows.

Apparatus: GPC 8220, produced by Tosoh Corporation
Detector: a differential refractive index (RI) detector
Column: KF-804 L (three columns), produced by Showa Denko K.K.
Sample: A copolymer (about 0.02 g) was dissolved in about 1 ml of tetrahydrofuran. The amount injected into GPC was 60 μl.

(2) Measurement ($^{13}$C-NMR) of Composition of Repeating Units and Terminal Structure in Copolymer
Apparatus: AV 400 produced by Bruker
Sample: About 1 g of a copolymer powder and 0.1 g of Cr(acac)$_2$ were dissolved in 0.5 g of MEK and 1.5 g of deuterated acetone.
Measurement: A sample was placed in a glass-made tube of 10 mm in inner diameter. Measurement was made at 40° C. at scanning times of 10,000.

(3) Measurement of Eth and γ Value
(3-1) Preparation of Lithography Composition
A lithography composition was prepared so as to give the following formulation.
Copolymer: 100 parts by mass
Component (X): 4-methylphenyl diphenyl sulfonium nonafluorobutanesulfonate 3.5 parts by mass
Component (Y): triethanolamine 0.2 part by mass
Component (Z): Surflon S-381 (produced by Seimi Chemical Co., Ltd.) 0.1 part by mass
Solvent: PGMEA 450 parts by mass and EL 300 parts by Mass (3-2) Dry Lithography
A lithography composition was spin-coated on a 4-inch silicon wafer, followed by prebaking (PAB) on a hot plate at 100° C. for 90 seconds, to form a thin film of 350 nm in thickness. To the thin film were applied 18 shots of 10 mm×10 mm □ at different exposure energies, using an ArF excimer laser exposure system (VUVES-4500 produced by Litho Tech Japan). Then, postbaking (PEB) was conducted at 120° C. for 90 seconds. Then, development was conducted with a 2.38 mass % tetramethylammonium hydroxide aqueous solution at 23° C. for 180 seconds using a resist development analyzer (RDA-800 produced by Litho Tech Japan), to measure, for each exposure energy, the change with time, of resist film thickness during development.

(3-3) Mimic Immersion Lithography
In the same manner as in the dry lithography, a lithography composition was spin-coated on a 4-inch silicon wafer, followed by prebaking (PAB), to form a thin film of 350 nm in thickness. The resulting wafer was immersed in a vat filled with ultra-pure water, for 30 seconds and taken out. Dry air was sprayed onto the wafer to remove the water droplets on the wafer. Then, to the wafer were applied 18 shots of 10 mm×10 mm □ at different exposure energies, using an ArF excimer laser exposure system (VUVES-4500 produced by Litho Tech Japan). The wafer after the exposure was immersed in a vat filled with ultra-pure water, for 30 seconds and taken out. Dry air was sprayed onto the wafer to remove the water droplets on the wafer. Then, post-baking (PEB) was conducted in the same manner as in the dry lithography. Thereafter, development was conducted using a resist development analyzer (RDA-800 produced by Litho Tech Japan), to measure, for each exposure energy, the change with time, of resist film thickness during development.

(3-4) Analysis
Based on the data obtained, there were plotted the logarithm of exposure energy (mJ/cm$^2$) and the ratio (%) of residual film thickness after 60-seconds development, to initial film thickness (hereinafter, the ratio is referred to simply as residual film ratio), to prepare a curve (hereinafter referred to as exposure energy-residual film ratio curve). Then, there were determined, as follows, Eth (which is an exposure energy required to achieve a residual film ratio of 0% and indicates sensitivity) and γ value (which is the inclination of the tangential line of the exposure energy-residual film ratio curve and indicates development contrast).

Eth: an exposure energy (mJ/cm$^2$) at which the exposure energy-residual film ratio curve intersects with a residual film ratio of 0%.

$$\gamma = 1/\{\log(E_0/E_{100})\}$$

wherein $E_{100}$ is an exposure energy when the tangential line of exposure energy-residual film ratio curve at $E_{50}$ (mJ./cm$^2$) ($E_{50}$ is an exposure energy at the residual film ratio 50% of exposure energy-residual film ratio curve) intersects with the line of residual film ratio 100%, and $E_0$ is an exposure energy when the above-mentioned tangential line intersects with the line of residual film ratio 0%.

(4) Measurement of Acid Value
There was weighed 4 g of an ethyl acetate solution containing 25% by mass of a monomer, or 4 g of a PGMEA solution containing 25% by mass of a monomer. Thereto was added 20 g of tetrahydrofuran for dissolution. 0.05 g of a methanol solution containing 1% by mass of Bromothymol Blue as an indicator was added, followed by addition of 0.5 g of water, to obtain a yellow solution. The solution was titrated with an aqueous NaOH (0.025 mol/liter) solution prepared beforehand with stirring. The end point was a timing when the solution color changed to green and then to slight blue. The calculation of acid value was made as follows.

$$\text{Acid value (mmol/g)} = (C_{NaOH} \times V_{NaOH})/(W_{szmp} \times C_{poly})$$

In the above, each symbol has the following meaning.
$C_{NaOH}$=NaOH concentration (mol/liter) in aqueous NaOH solution
$V_{NaOH}$: amount (ml) of aqueous NaOH solution titrated
$W_{szmp}$: weight (g) of sample used in measurement
$C_{poly}$: concentration (mass %) of copolymer contained in sample Incidentally, titration was conducted five times and there were determined its average and 3σ.

Synthesis Example 1-1

1.2 kg of a commercially available monomer G {Lot 1 produced by Osaka Organic Chemical Ind. Ltd. (hereinafter referred to as commercially available monomer G$_1$)} was dissolved in 3.6 kg of ethyl acetate. The resulting solution was added into 4.8 kg of water kept at 20 to 25° C., with stirring. Stirring was continued for further 15 minutes, followed by standing for 30 minutes. The aqueous phase was removed. Then, the organic phase was heated under reduced pressure while N2 gas was being blown thereinto, to distil off light components to obtain a purified monomer G$_1$. The acid value of the purified monomer was under the quantitating limit (0.002 mmol/g).

Synthesis Example 1-2

A purified monomer G$_2$ was obtained in the same manner as in Synthesis Example 1-1 except that a commercially available monomer G$_2$ (Lot 2 produced by Osaka Organic Chemical Ind. Ltd.) was used in place of the commercially available monomer G$_1$. The acid value of the purified monomer was the lower limit (0.002 mmol/g) of measurement or lower.

Synthesis Example 2-1

A purified monomer Ma$_1$ was obtained in the same manner as in Synthesis Example 1-1 except that a commercially available monomer Ma {Lot 1 produced by ENF (hereinafter referred to as commercially available monomer $Ma_1$)} was used in place of the commercially available monomer $G_1$. The acid value of the purified monomer was the lower limit (0.002 mmol/g) of measurement or lower.

Synthesis Example 2-2

A purified monomer $Ma_2$ was obtained in the same manner as in Synthesis Example 2-1 except that a commercially available monomer $Ma_2$ (Lot 2 produced by ENF) was used in place of the commercially available monomer $Ma_1$. The acid value of the purified monomer was the lower limit (0.002 mmol/g) of measurement or lower.

Synthesis Example 3-1

1.0 kg of a commercially available monomer Oa {Lot 1 produced by Idemitsu Kosan Co., Ltd. (hereinafter referred to as commercially available monomer $Oa_1$)} was dissolved in 3.0 kg of ethyl acetate. The resulting solution was added into 4.0 kg of water kept at 20 to 25° C., with stirring. Stirring was continued for further 15 minutes, followed by standing for 30 minutes. The aqueous phase was removed. Then, the organic phase was heated under reduced pressure to distil off light components, whereby the organic phase was concentrated. 5.0 kg of hexane was added to separate out a solid content. The solid content was recovered by filtration and dried under reduced pressure to obtain a purified monomer $Oa_1$. The acid value of the purified monomer was the lower limit (0.002 mmol/g) of measurement or lower.

Synthesis Example 3-2

A purified monomer $Oa_2$ was obtained in the same manner as in Synthesis Example 3-1 except that a commercially available monomer $Oa_2$ (Lot 2 produced by Idemitsu Kosan Co., Ltd.) was used in place of the commercially available monomer $Oa_1$. The acid value of the purified monomer was the lower limit (0.002 mmol/g) of measurement or lower.

Synthesis Example 3-3

1.0 kg of the commercially available monomer $Oa_1$ was dissolved in 3.0 kg of ethyl acetate. The resulting solution was passed, at an LHSV of 5/hr, through an ion exchange layer of 5 cm in diameter and 30 cm in height, obtained by filling 470 g of AMBERLYST EG-290 {an ion exchange resin produced by Organo Corporation and a 1:1 mixture of a substituent group-containing anion exchange resin (E1 mentioned previously) and a sulfonic acid group-containing cation exchange resin} and then passing therethrough 2.4 kg of methanol and 2.4 kg of ethyl acetate in this order for cleaning. The ion exchange layer was kept at 20 to 25° C. during the passage of the solution. The solution after the passage through the ion exchange layer was heated under reduced pressure to distil off light components, whereby the solution was concentrated. Then, 5.0 Kg of hexane was added to separate out a solid. The solid was recovered by filtration and dried under reduced pressure to obtain a purified monomer $Oa_3$. The acid value of the purified monomer was the lower limit (0.002 mmol/g) of measurement or lower.

Example 1

In a vessel were placed 3.1 kg of MEK, 0.7 kg of the purified monomer $G_1$ obtained in Synthesis Example 1, 1.0 kg of the purified monomer $Ma_1$ obtained in Synthesis Example 2, and 0.5 kg of the purified monomer $Oa_1$ obtained in Synthesis example 3 to prepare a uniform "monomers solution". In another vessel were placed 0.2 kg of MEK and 0.07 kg of MAIB to prepare a uniform "initiator solution". Into a polymerization vessel provided with a stirrer and a cooler was fed 1.8 kg of MEK, and the vessel inside was filled with nitrogen. The MEK inside the polymerization vessel was heated to 79° C. Into the polymerization vessel kept at 79 to 81° C. were dropped separately the monomers solution and the initiator solution both kept at 25 to 30° C., at constant rates in 4 hours, using metering pumps, to give rise to polymerization. After the completion of the dropping, aging was conducted at 80 to 81° C. for 2 hours, after which the polymerization solution was cooled to room temperature.

22 kg of hexane was placed in a purification vessel provided with a stirrer. The hexane temperature was cooled to 15° C. with stirring and this state was kept. Thereinto was dropped the above-obtained polymerization solution to separate our a copolymer. Stirring was continued for further 30 minutes and filtration was conducted to obtain a wet cake. The wet cake was returned to the vessel; 12 kg of hexane and 3 kg of MEK were added; stirring was conducted for 30 minutes for cleaning; then, filtration was conducted. The cleaning of wet cake was repeated once more. Several grams were taken from the resulting wet cake and dried at 60° C. or lower for 1 hour under reduced pressure to obtain a dry powder of a copolymer. The powder (copolymer) was measured for proportions of repeating units G, Ma and Oa, Mw and Mw/Mn. The results are shown in Table 1.

The remainder of the wet cake was dissolved in MEK. The solution was heated under reduced pressure with stirring to distil off part of light components (e.g. MEK). While PGMEA was being added, part of the light components and PGMEA was distilled off to obtain a PGMEA solution containing 25% by mass of a copolymer. The acid value of the copolymer in the PGMEA solution was measured. Then, a lithography composition was prepared by the above-mentioned method and measured for Eth and γ value. The results are shown in Table 1.

Example 2

A copolymer and a lithography composition were obtained in the same manner as in Example 1 except that the purified monomer $G_2$, the purified monomer Mae and the purified monomer $Oa_2$ were used respectively in place of the purified monomer $G_1$, the purified monomer $Ma_1$ and the purified monomer $Oa_1$. In Table 1 are shown the proportions of repeating units G, Ma and Oa, Mw, Mw/Mn and acid value of the copolymer, and the Eth and γ value of the lithography composition.

Example 3

A copolymer and a lithography composition were obtained in the same manner as in Example 1 except that the purified monomer $Oa_3$ was used in place of the purified monomer $Oa_1$. In Table 1 are shown the proportions of repeating units G, Ma and Oa, Mw, Mw/Mn and acid value of the copolymer, and the Eth and γ value of the lithography composition.

Comparative Example 1

A copolymer and a lithography composition were obtained in the same manner as in Example 1 except that the commercially available monomer $G_1$, the commercially available monomer Ma₁ and the commercially available monomer Oa₁ were used respectively in place of the purified monomer G₁, the purified monomer Ma₁ and the purified monomer Oa₁. In Table 1 are shown the proportions of repeating units G, Ma and Oa, Mw, Mw/Mn and acid value of the copolymer, and the Eth and γ value of the lithography composition.

Comparative Example 2

A copolymer and a lithography composition were obtained in the same manner as in Example 1 except that the commercially available monomer G₂, the commercially available monomer Mae and the commercially available monomer Oa₂ were used respectively in place of the purified monomer G₁, the purified monomer Ma₁ and the purified monomer Oa₁. In Table 1 are shown the proportions of repeating units G, Ma and Oa, Mw, Mw/Mn and acid value of the copolymer, and the Eth and γ value of the lithography composition.

the copolymer in a solvent and subjecting the solution to neutralization titration with a solution of an alkali metal hydroxide using Bromothymol Blue as an indicator,
wherein the acid-labile, dissolution-suppressing group of the repeating unit (A) is selected from a structure represented by the following formula (L2)

[formula 2]

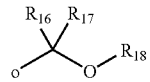

(L2)

{in the formula (L2), o is a bonding site of the acid-labile, dissolution-suppressing group, R₁₆ and R₁₇ are each independently a hydrogen atom or a hydrocarbon group having 1 to 4 carbon atoms, R₁₈ is a hydrocarbon group having 1 to 12 carbon atoms, and R₁₆ may bond with R₁₇ or R₁₈ to form a ring}.

TABLE 1

| | NMR mol % | | | GPC | | Acid value mmol/g | | Dry | | Immersion | |
|---|---|---|---|---|---|---|---|---|---|---|---|
| | G | Ma | Oa | Mw | Mw/Mn | average | 3 sigma | Eth* | γ value | Eth* | γ value |
| Ex. 1 | 39.4 | 40.3 | 20.3 | 9780 | 2.05 | 0.008 | 0.002 | 10.2 | 29.3 | 12.0 | 24.7 |
| Ex. 2 | 39.5 | 40.4 | 20.1 | 9800 | 2.04 | 0.007 | 0.002 | 10.3 | 29.9 | 11.9 | 25.2 |
| Ex. 3 | 39.4 | 40.4 | 20.2 | 9830 | 2.05 | 0.004 | 0.002 | 10.5 | 31.5 | 11.7 | 25.5 |
| Comp. Ex. 1 | 40.8 | 38.2 | 21.0 | 10140 | 2.11 | 0.109 | 0.004 | 9.0 | 15.1 | 14.0 | 11.3 |
| Comp. Ex. 2 | 40.0 | 39.4 | 20.6 | 9950 | 2.08 | 0.047 | 0.003 | 10.6 | 17.8 | 12.7 | 14.7 |

*Unit of Eth: mJ/cm²

The copolymer of the present invention and the lithography composition containing the copolymer were evaluated for lithography properties under dry and immersion conditions using ArF exposure. As a result, by using the present copolymer having an acid value of 0.01 mmol/g or less as determined by titration with an aqueous NaOH solution using Bromothymol Blue as an indicator, there was obtained a high γ value indicating a high resolution contrast, in each lithography conditions. This shows that the copolymer of the present invention and the lithography composition containing the copolymer are superior in resolution of fine pattern.

The invention claimed is:

1. A process for producing a copolymer for semiconductor lithography, having at least (A) a repeating unit having a structure which has an alkali-soluble group protected by an acid-labile, dissolution-suppressing group, (B) a repeating roup unit having a lactone structure and (C) a repeating unit having an alcoholic hydroxyl group, which process being characterized by dissolving at least one monomer of a monomer giving the repeating unit (A) in an organic solvent to produce a first solution, dissolving at least one monomer of a monomer giving the repeating unit (B) in the organic solvent to produce a second solution, dissolving at least one monomer of a monomer giving the repeating unit (C) in the organic solvent to produce a third solution, contacting each of the resulting solutions with water followed by giving rise to phase separation, and, thereafter, copolymerizing the monomers, and the copolymer being characterized by having an acid value of 0.01 mmol/g or less as determined by dissolving 2. The process for producing the copolymer for semiconductor lithography according to claim 1, wherein the repeating unit (A) has a structure represented by the following formula (A)

[formula 3]

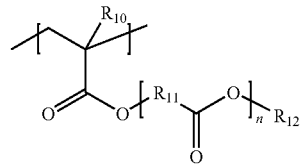

(A)

{in the formula (A), R₁₀ is a hydrogen atom or a hydrocarbon group having 1 to 4 carbon atoms, which may be substituted with fluorine atom, R₁₁ is an alicyclic hydrocarbon group having 6 to 12 carbon atoms, which may contain oxygen atom or sulfur atom, n is an integer of 0 or 1, and R₁₂ is an acid-labile, dissolution-suppressing group represented by the formula (L2)}.

3. The process for producing the copolymer for semiconductor lithography according to claim 1, wherein the repeating unit (B) has a structure represented by the following formula (B)

[formula 4]

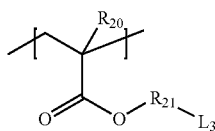
(B)

[in the formula (B), $R_{20}$ is a hydrogen atom or a hydrocarbon group having 1 to 4 carbon atoms, which may be substituted with fluorine atom, $R_{21}$ is a single bond or an alicyclic hydrocarbon group having 5 to 12 carbon atoms, which may contain oxygen atom or sulfur atom, L3 has a lactone structure represented by the following formula (L3)

[formula 5]

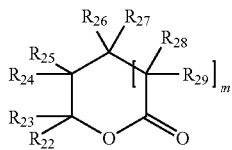
(L3)

{in the formula (L3), either one of $R_{22}$ to $R_{29}$ is a single bond having a bonding site as $R_{21}$, and the remainder of $R_{22}$ to $R_{29}$ is a hydrogen atom, or, a hydrocarbon or alkoxy group having 1 to 4 carbon atoms, or, either one of $R_{22}$ to $R_{29}$ is a hydrocarbon group having 3 to 12 carbon atoms having a bonding site as $R_{21}$ and bonds with either one or two of the remainder of $R_{22}$ to $R_{29}$ to form an alicyclic ring having 5 to 15 carbon atoms and which may contain oxygen atom or sulfur atom, and the remainder of $R_{22}$ to $R_{29}$ is such that either one or two of the remainder is a single bond for forming the above-mentioned alicyclic ring having 5 to 15 carbon atoms and the rest of the remainder is a hydrogen atom, or, a hydrocarbon or alkoxy group having 1 to 4 carbon atoms, and m is an integer of 0 or 1}, and L3 is bonded with $R_{21}$ in one or two single bonds].

4. The process for producing the copolymer for semiconductor lithography according to claim 1, wherein the repeating unit (C) has a structure represented by the following formula (C)

[formula 6]

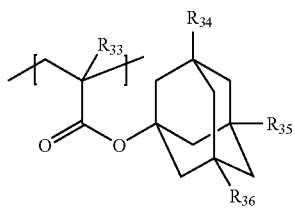
(C)

{in the formula (C), $R_{33}$ is a hydrogen atom or a hydrocarbon group having 1 to 4 carbon atoms, which may be substituted with fluorine atom, $R_{34}$ to $R_{36}$ are each independently a hydrogen atom or a hydroxyl group, and at least one of $R_{34}$ to $R_{36}$ is a hydroxyl group}.

5. A composition for semiconductor lithography, characterized by comprising at least the copolymer formed according to the process of claim 1, a radiation-sensitive acid generator and an organic solvent.

6. A composition for semiconductor lithography according to claim 5, which is used in dry lithography.

7. A composition for semiconductor lithography according to claim 5, which is used in immersion lithography.

8. A process for producing a copolymer for semiconductor lithography, having at least (A) a repeating unit having a structure which has an alkali-soluble group protected by an acid-dissociable dissolution-suppressing group, (B) a repeating unit having a lactone structure and (C) a repeating unit having an alcoholic hydroxyl group, which process being characterized by dissolving at least one monomer of a monomer giving the repeating unit (A) in an organic solvent to produce a first solution, dissolving at least one monomer of a monomer giving the repeating unit (B) in the organic solvent to produce a second solution, dissolving at least one monomer of a monomer giving the repeating unit (C) in the organic solvent to produce a third solution, contacting each of the resulting solutions with an ion exchange resin, and, thereafter, copolymerizing the monomers, and the copolymer being characterized by having an acid value of 0.01 mmol/g or less as determined by dissolving the copolymer in a solvent and subjecting the solution to neutralization titration with a solution of an alkali metal hydroxide using Bromothymol Blue as an indicator,
wherein the acid-labile, dissolution-suppressing group of the repeating unit (A) is selected from a structure represented by the following formula (L2)

[formula 2]

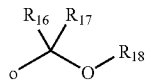
(L2)

{in the formula (L2), o is a bonding site of the acid-labile, dissolution-suppressing group, $R_{16}$ and $R_{17}$ are each independently a hydrogen atom or a hydrocarbon group having 1 to 4 carbon atoms, $R_{18}$ is a hydrocarbon group having 1 to 12 carbon atoms, and $R_{16}$ may bond with $R_{17}$ or $R_{18}$ to form a ring}.

9. The process for producing the copolymer for semiconductor lithography according to claim 8, wherein the repeating unit (A) has a structure represented by the following formula (A)

[formula 3]

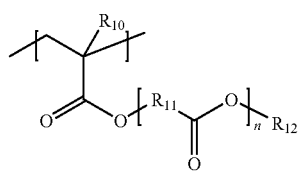
(A)

{in the formula (A), $R_{10}$ is a hydrogen atom or a hydrocarbon group having 1 to 4 carbon atoms, which may be substituted with fluorine atom, $R_{11}$ is an alicyclic hydrocarbon group having 6 to 12 carbon atoms, which may contain oxygen atom or sulfur atom, n is an integer of 0 or 1, and $R_{12}$ is an acid-labile, dissolution-suppressing group represented by the formula (L2)}.

10. The process for producing the copolymer for semiconductor lithography according to claim 8, wherein the repeating unit (B) has a structure represented by the following formula (B)

[formula 4]

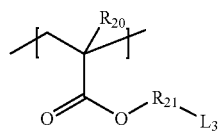
(B)

[in the formula (B), $R_{20}$ is a hydrogen atom or a hydrocarbon group having 1 to 4 carbon atoms, which may be substituted with fluorine atom, $R_{21}$ is a single bond or an alicyclic hydrocarbon group having 5 to 12 carbon atoms, which may contain oxygen atom or sulfur atom, L3 has a lactone structure represented by the following formula (L3)

[formula 5]

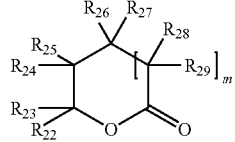
(L3)

{in the formula (L3), either one of $R_{22}$ to $R_{29}$ is a single bond having a bonding site as $R_{21}$, and the remainder of $R_{22}$ to $R_{29}$ is a hydrogen atom, or, a hydrocarbon or alkoxy group having 1 to 4 carbon atoms, or, either one of $R_{22}$ to $R_{29}$ is a hydrocarbon group having 3 to 12 carbon atoms having a bonding site as $R_{21}$ and bonds with either one or two of the remainder of $R_{22}$ to $R_{29}$ to form an alicyclic ring having 5 to 15 carbon atoms and which may contain oxygen atom or sulfur atom, and the remainder of $R_{22}$ to $R_{29}$ is such that either one or two of the remainder is a single bond for forming the above-mentioned alicyclic ring having 5 to 15 carbon atoms and the rest of the remainder is a hydrogen atom, or, a hydrocarbon or alkoxy group having 1 to 4 carbon atoms, and m is an integer of 0 or 1}, and L3 is bonded with $R_{21}$ in one or two single bonds].

11. The process for producing the copolymer for semiconductor lithography according to claim 8, wherein the repeating unit (C) has a structure represented by the following formula (C)

[formula 6]

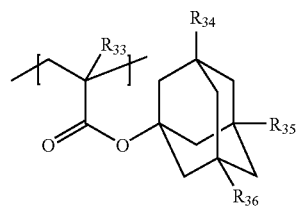
(C)

{in the formula (C), $R_{33}$ is a hydrogen atom or a hydrocarbon group having 1 to 4 carbon atoms, which may be substituted with fluorine atom, $R_{34}$ to $R_{36}$ are each independently a hydrogen atom or a hydroxyl group, and at least one of $R_{34}$ to $R_{36}$ is a hydroxyl group}.

12. A composition for semiconductor lithography, characterized by comprising at least the copolymer formed according to the process of claim 10, a radiation-sensitive acid generator and an organic solvent.

* * * * *

UNITED STATES PATENT AND TRADEMARK OFFICE
CERTIFICATE OF CORRECTION

PATENT NO. : 8,859,180 B2
APPLICATION NO. : 12/311993
DATED : October 14, 2014
INVENTOR(S) : Tomo Oikawa et al.

It is certified that error appears in the above-identified patent and that said Letters Patent is hereby corrected as shown below:

In the Claims

1. At column 43, line 55, claim 1, line 5, please delete the word "roup".

2. At column 48, line 37, claim 12, line 3, please delete the phrase "claim 10" and replace with --claim 8--.

Signed and Sealed this
Tenth Day of February, 2015

Michelle K. Lee
*Deputy Director of the United States Patent and Trademark Office*